United States Patent
Tsugane et al.

(10) Patent No.: US 6,784,047 B2
(45) Date of Patent: Aug. 31, 2004

(54) SEMICONDUCTOR DEVICES AND METHODS FOR MANUFACTURING THE SAME

(75) Inventors: Hiroaki Tsugane, Sakata (JP); Hisakatsu Sato, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/759,915

(22) Filed: Jan. 13, 2001

(65) Prior Publication Data

US 2001/0031528 A1 Oct. 18, 2001

(30) Foreign Application Priority Data

Jan. 14, 2000 (JP) ......................... 2000-005335

(51) Int. Cl.[7] ........................................... H01L 21/8244
(52) U.S. Cl. ..................... 438/238; 438/255; 438/381
(58) Field of Search ................................ 438/253, 254, 438/255, 396, 397, 398, 238, 381, 382, 384, 210; 257/296

(56) References Cited

U.S. PATENT DOCUMENTS

| | | | |
|---|---|---|---|
| 4,598,460 A | | 7/1986 | Owens et al. |
| 5,356,826 A | * | 10/1994 | Natsume ............ 148/DIG. 136 |
| 5,420,449 A | | 5/1995 | Oji |
| 5,489,547 A | * | 2/1996 | Erdeljac et al. .............. 257/350 |
| 5,539,229 A | | 7/1996 | Noble, Jr et al. |
| 5,747,385 A | | 5/1998 | Torii |
| 5,928,959 A | | 7/1999 | Huckels et al. |
| 5,930,618 A | | 7/1999 | Sun et al. |
| 5,994,730 A | | 11/1999 | Shrivastava et al. |
| 6,010,931 A | | 1/2000 | Sun et al. |
| 6,022,781 A | | 2/2000 | Nobel, Jr. et al. |

(List continued on next page.)

FOREIGN PATENT DOCUMENTS

| | | |
|---|---|---|
| JP | 09-116113 | 5/1997 |
| JP | 09-232531 | 9/1997 |
| JP | 09-260607 | 10/1997 |
| JP | 09-321242 | 12/1997 |
| JP | 10-083067 | 3/1998 |
| JP | 10-284702 | 10/1998 |
| JP | 11-074487 | 3/1999 |
| JP | 11-150248 | 6/1999 |
| JP | 11-214656 | 8/1999 |
| JP | 11-317503 | 11/1999 |
| JP | 11-330272 | 11/1999 |
| JP | 11-340433 | 12/1999 |
| JP | 2000-196037 | 7/2000 |

OTHER PUBLICATIONS

U.S. Ser. No. 09/742,474, having U.S. patent application Publication No. US2001/0005610 A1, published Jun. 28, 2001, filed Dec. 22, 2000.

(List continued on next page.)

*Primary Examiner*—Tuan H. Nguyen
(74) *Attorney, Agent, or Firm*—Konrad Raynes & Victor, LLP; Alan S. Raynes

(57) ABSTRACT

Certain embodiments of the present invention relate to a method for manufacturing a semiconductor device in which, when a cell capacitor of a DRAM and a capacitor element in an analog element region are mix-mounted on the same chip, the manufacturing steps can be simplified. First, the connection layer 19 and the bit line 300 are simultaneously formed. Next, the lower electrodes 55a and 55b of the capacitor elements 600a and 600b and the storage nodes 53a and 53b of the cell capacitors 700a and 700b are simultaneously formed. Next, a dielectric layer (ON layer 61) of the capacitor elements 600a and 600b and a dielectric layer (ON layer 61) of the cell capacitors 700a and 700b are simultaneously formed. Then, the upper electrodes 69a and 69b of the capacitor elements 600a and 600b and the cell plate 67 of the cell capacitors 700a and 700b are simultaneously formed.

16 Claims, 22 Drawing Sheets

U.S. PATENT DOCUMENTS

| | | | |
|---|---|---|---|
| 6,025,620 | A | 2/2000 | Kimura et al. |
| 6,040,596 | A | 3/2000 | Choi et al. |
| 6,074,908 | A | 6/2000 | Huang |
| 6,077,742 | A | 6/2000 | Chen et al. |
| 6,104,053 | A * | 8/2000 | Nagai .................. 257/303 |
| 6,110,772 | A * | 8/2000 | Takada et al. ............. 438/238 |
| 6,137,179 | A | 10/2000 | Huang |
| 6,204,105 | B1 * | 3/2001 | Jung .................. 438/238 |
| 6,215,142 | B1 | 4/2001 | Lee et al. |
| 6,242,296 | B1 | 6/2001 | Sun |
| 6,262,446 | B1 * | 7/2001 | Koo et al. ............. 257/296 |
| 6,291,847 | B1 | 9/2001 | Ohyu et al. |
| 6,303,432 | B1 | 10/2001 | Horita et al. |
| 6,353,269 | B1 | 3/2002 | Huang |
| 6,384,444 | B2 | 5/2002 | Sakoh |
| 6,404,001 | B2 | 6/2002 | Koo et al. |
| 2001/0013632 | A1 | 8/2001 | Richluso |

OTHER PUBLICATIONS

U.S. Ser. No. 09/915,660, having U.S. patent application Publication No. US2002/0025678 A1, published Feb. 28, 2002, filed Jul. 26, 2001 (Div of Appl. No. 09/484,786 filed Jan. 18, 2000).

U.S. Ser. No. 09/759,665, having U.S. patent application Publication No. US2001/0031532 A1, published Oct. 18, 2001, filed Jan. 13, 2001, and pending claims.

U.S. Ser. No. 09/759,666, having U.S. patent application Publication No. US2001/0023098 A1, published Sep. 20, 2001, filed Jan. 13, 2001, and pending claims.

U.S. Ser. No. 09/759,715, having U.S. patent application Publication No. US2001/0032993 A1, published Oct. 25, 2001, filed Jan. 13, 2001, and pending claims.

* cited by examiner

US 6,784,047 B2

SEMICONDUCTOR DEVICES AND METHODS FOR MANUFACTURING THE SAME

REFERENCE TO CROSS-RELATED APPLICATIONS

Japanese patent application no. 2000-5335, filed Jan. 14, 2000, is hereby incorporated by reference in its entirety. U.S. patent application Ser. No. 09/759,665, filed on Jan. 13, 2001, is hereby incorporated by reference in its entirety. U.S. patent application Ser. No. 09/759,666, filed on Jan. 13, 2001, is hereby incorporated by reference in its entirety. U.S. patent application Ser. No. 09/759,715, filed on Jan. 13, 2001, is hereby incorporated by reference in its entirety.

TECHNICAL FIELD

The present invention relates to semiconductor devices that mix-mount DRAMs (Dynamic Random Access Memories) and other device elements in the same chip, and methods for manufacturing the same.

BACKGROUND

In recent years, mixed-mounting of various types of circuits is required in consideration of various factors, such as, for example, to shorten the chip interface delay, to reduce the cost per board area, and to reduce the cost in design and development of boards. There are problems in the mix-mounting technology in that the process becomes complex and the IC cost increases.

SUMMARY

One embodiment relates to a method for manufacturing a semiconductor device, the semiconductor device having a DRAM including a cell capacitor formed in a DRAM region of a semiconductor substrate, and a capacitor element formed in an analog element region of the semiconductor substrate. The method includes (a) simultaneously forming a bit line that is a component of the DRAM and a connection layer that is located in a common layer with the bit line and this is used to electrically connect a lower electrode of the capacitor element and another semiconductor element; (b) simultaneously forming a storage node of the cell capacitor and the lower electrode; (c) simultaneously forming a dielectric layer of the cell capacitor and a dielectric layer of the capacitor element; and (d) simultaneously forming a cell plate of the cell capacitor and an upper electrode of the capacitor element.

Embodiments also includes a semiconductor device having a DRAM including a cell capacitor formed in a DRAM region of a semiconductor substrate, and a capacitor element formed in an analog element region of the semiconductor substrate. The semiconductor device includes an interlayer dielectric layer, an embedded connection layer and a connection layer, wherein the interlayer dielectric layer is located between the semiconductor substrate and the capacitor element. The connection layer and the embedded connection layer are used to electrically connect a lower electrode of the capacitor element to another semiconductor element. The connection layer is located in a common layer of a bit line that is a component of the DRAM. The embedded connection layer is located in a connection hole formed in the interlayer dielectric layer. One end of the embedded connection layer connects to the lower electrode at a bottom surface of the lower electrode, and another end of the embedded connection layer connects to the connection layer.

Embodiments also relate to a method for manufacturing a semiconductor device, the semiconductor device having a DRAM including a cell capacitor formed in a DRAM region of a semiconductor substrate, and a capacitor element formed in an analog element region of the semiconductor substrate. The method includes forming a first conducting layer and etching a portion of the first conducting layer to form a bit line that is a component of the DRAM and a connection layer that is located in a common layer with the bit line and used to electrically connect a lower electrode of the capacitor element and another semiconductor element. The method also includes forming a second conducting layer and etching a portion of the second conducting layer to form a storage node of the cell capacitor and the lower electrode. The method also includes forming a dielectric layer and etching a portion of the dielectric layer to form a dielectric layer of the cell capacitor and a dielectric layer of the capacitor element. In addition, the method includes forming a third conducting layer and etching a portion of the third conducting layer to form a cell plate of the cell capacitor and an upper electrode of the capacitor element.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
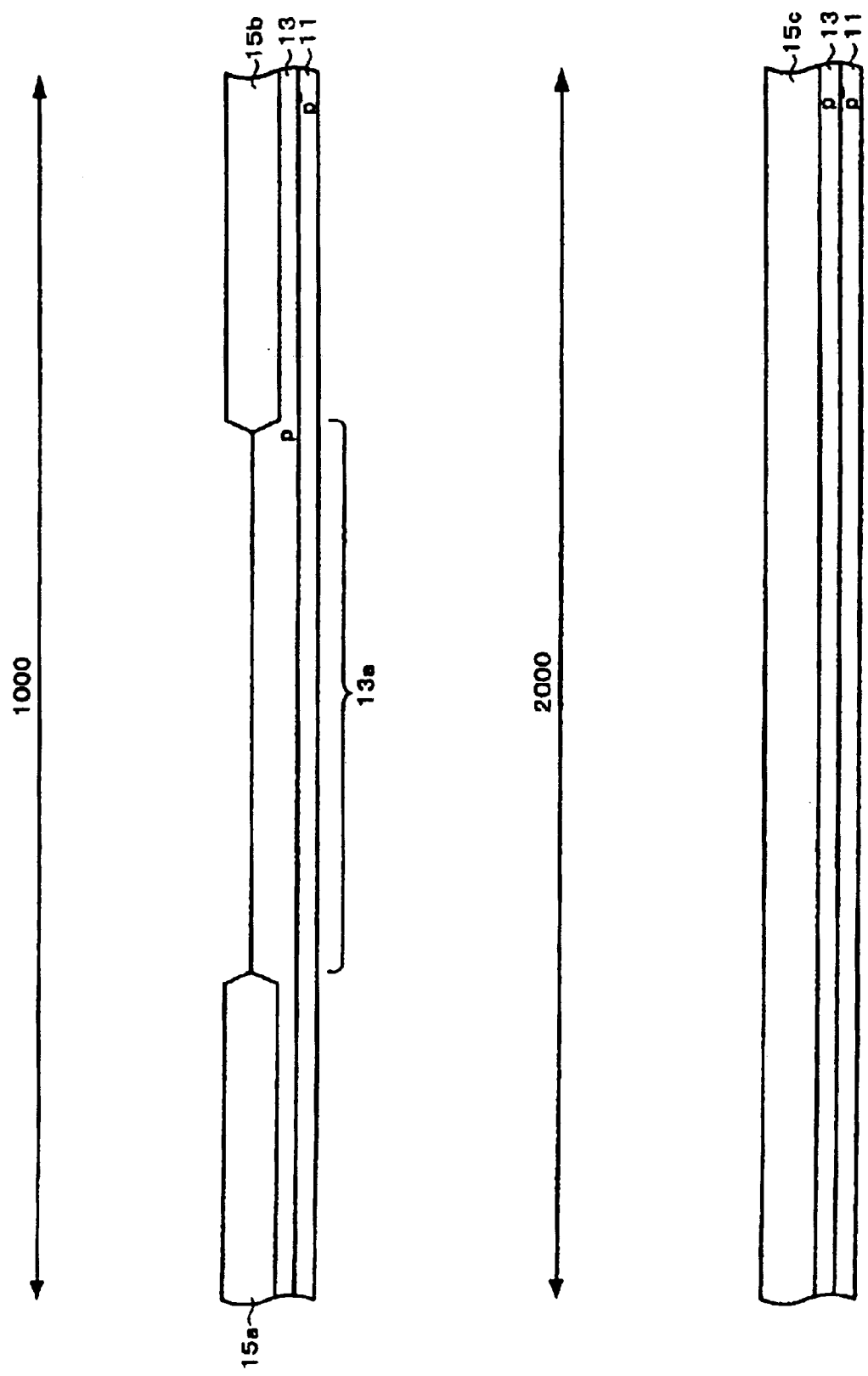
FIG. 1 schematically shows a cross section of a silicon substrate, which is used to describe a method for manufacturing a semiconductor device in accordance with a first embodiment of the present invention.

Certain embodiments of the present invention relate to a semiconductor device having a DRAM and another element that are mounted on the same chip, which can simplify the manufacturing steps and provide the other element with a designated performance, and methods for manufacturing the same.

Certain embodiments of the present invention relate to a method for manufacturing a semiconductor device, the semiconductor device having a DRAM including a cell capacitor formed in a DRAM region of a semiconductor substrate, and a capacitor element formed in an analog element region of the semiconductor substrate, the method comprising the steps of: (a) simultaneously forming a bit line that is a component of the DRAM and a connection layer that is located in a common layer with the bit line and this is used to electrically connect a lower electrode of the capacitor element and another semiconductor element; (b) simultaneously forming a storage node of the cell capacitor and the lower electrode; (c) simultaneously forming a dielectric layer of the cell capacitor and a dielectric layer of the capacitor element; and (d) simultaneously forming a cell plate of the cell capacitor and an upper electrode of the capacitor element.

By the method for manufacturing a semiconductor device including the above-described steps, the cell capacitor and the capacitor element are simultaneously formed. As a result, the manufacturing steps are simplified, compared to the case where they are independently formed.

Also, by the method for manufacturing a semiconductor device including the above-described steps, the connection layer and the bit line that is a component of the DRAM are simultaneously formed. As a result, the manufacturing steps are simplified, compared to the case where they are independently formed.

It is noted that in certain embodiments a cell capacitor refers to an element that composes a memory cell of a DRAM. The same definition applies to cell capacitors described below.

Also, a capacitor element may be used for, for example, an A/D converter, a D/A converter, a switched capacitor filter, a phase capacitor of an operational amplifier, a low-pass filter of a PLL, a bypass capacitor of a power source, a decoupling capacitor, and the like. Capacitor elements described below may be used in the same manner.

It is also noted that in certain embodiments another semiconductor element refers to an element (for example, a transistor, a capacitor element, a resistance element, and a wiring) that composes an analog circuit. The same definition applies to other semiconductor elements described below.

The following step may be added to the method for manufacturing a semiconductor device described above in accordance with certain embodiments of the present invention. Namely, certain embodiments further comprise the step of: (e) forming a first resistance element and a second resistance element in the analog element region, wherein the step (e) is an identical step with the step (d), and wherein, in the step (e), the number of ion-implantation of impurity in a region where the first resistance element is to be formed is greater than the number of ion-implantation of impurity in a region where the second resistance element is to be formed to lower a resistance value of the first resistance element than a resistance value of the second resistance element.

By the method for manufacturing a semiconductor device including the above-described step in accordance with certain embodiments of the present invention, the first and second resistance elements can be formed with resistance values different from each other.

The following step may be added to the method for manufacturing a semiconductor device in accordance with the certain embodiments of the present invention. Namely, certain embodiments further comprise the step of: (e) forming a first resistance element and a second resistance element in the analog element region, wherein the step (e) is an identical step with the step (d), and wherein, in the step (e), an impurity is diffused in a region where the first resistance element is to be formed to lower a resistance value of the first resistance element than a resistance value of the second resistance element.

By the method for manufacturing a semiconductor device including the above-described step in accordance with certain embodiments of the present invention, the first and second resistance elements can be formed with resistance values different from each other.

Furthermore, by the method for manufacturing a semiconductor device including the above-described step in accordance with certain embodiments of the present invention, the minimum resistance value of the first resistance element can be lowered. In other words, the number of ion-implantation of impurity in the first resistance element may be made greater than the number of ion-implantation of impurity in the second resistance element, such that a resistance value of the first resistance element is lower than a resistance value of the second resistance element, as described above. However, the minimum resistance value achieved only by ion-implantation is relatively high (for example, 200~300 Ω/€). In contrast, by the impurity diffusion, the minimum resistance value can be made lower than that attained only by ion-implantation (for example, 10~100 Ω/€). Accordingly, by the impurity diffusion, the minimum resistance value of the first resistance element can be lowered, and therefore, a range of resistance values that can be selected can be made wider.

The following step may be added to the method for manufacturing a semiconductor device in accordance with certain embodiments of the present invention. Namely, certain embodiments further comprise the step of: (e) forming a first resistance element and a second resistance element in the analog element region, wherein the step (e) is an identical step with the step (d), and wherein, in the step (e), a silicide layer is formed in a region where the first resistance element is to be formed to lower a resistance value of the first resistance element than a resistance value of the second resistance element.

By the method for manufacturing a semiconductor device including the above-described step in accordance with certain embodiments of the present invention, the first and second resistance elements can be formed with resistance values different from each other.

Furthermore, by the method for manufacturing a semiconductor device including the above-described step in accordance with certain embodiments of the present invention, the minimum resistance value of the first resistance element can be further lowered. In other words, by forming a silicide layer at the first resistance element, the lowest resistance value can be lowered than that achieved by only the ion-implantation (for example, 5~10 Ω/€). Accordingly, since the formation of the silicide layer can further lower the minimum resistance value of the first resistance element, a range of resistance values that can be selected can be made wider.

In accordance with certain embodiments of the present invention, a semiconductor device has a DRAM including a cell capacitor formed in a DRAM region of a semiconductor substrate and a capacitor element formed in an analog element region of the semiconductor substrate, wherein the semiconductor device comprises: an interlayer dielectric layer, an embedded connection layer and a connection layer, wherein the interlayer dielectric layer is located between the semiconductor substrate and the capacitor element, the connection layer and the embedded connection layer are used to electrically connect a lower electrode of the capacitor element to another semiconductor element, the connection layer is located in the same layer where a bit line that is a component of the DRAM is provided, the embedded connection layer is located in a connection hole formed in the interlayer dielectric layer, one end section of the embedded connection layer connects to the lower electrode at a bottom surface of the lower electrode, and another end section of the embedded connection layer connects to the connection layer.

By the semiconductor device with the above-described structure in accordance with certain embodiments of the present invention, the area of the capacitor element can be made smaller. More specifically, the lower electrode of the capacitor element is electrically connected to the semiconductor element by the connection layer and the embedded connection layer. The embedded connection layer is located below the lower electrode, and is connected to the lower electrode at the bottom surface of the lower electrode. As a result, the entire side surface of the lower electrode can be faced with an upper electrode, and therefore the area of the capacitor element can be reduced, accordingly.

In this manner, since the area of the capacitor element can be made smaller, the semiconductor device can be further miniaturized.

It is noted that the embedded connection layer is composed of a conductive material (for example, polysilicon, amorphous silicon, and high-melting point metal such as tungsten). The material for the embedded connection layer may be the same as the material of the lower electrode, or may be different from the material of the lower electrode.

By the structure describe above, the problem in which noises are transmitted to the capacitor element becomes difficult to occur. More specifically, when the connection layer is defined by, for example, an impurity region formed in the semiconductor substrate, electric charges may flow from a well that connects to the impurity region to the capacitor element. This may cause malfunctions of a circuit that includes the capacitor element. In contrast, in accordance with certain embodiments of the present invention having the above-described structure, the connection layer is provided in the same layer in which the bit line that is a component of the DRAM is provided. As a result, the problem of noise transmission becomes difficult to occur.

It is noted that the connection layer is composed of a conductive material (for example, polysilicon, amorphous silicon, titanium silicide, and tungsten silicide). The connection layer is preferably composed of the same material as that of the bit line.

The following structure may be added to the semiconductor device in accordance with certain embodiments of the present invention. Namely, the semiconductor device may further comprise another capacitor element, wherein the other capacitor element is located in the analog element region, and the capacitor element and the other capacitor element are serially connected to each other by the embedded connection layer and the connection layer.

In accordance with certain embodiments of the present invention with the above-described structure, the capacitor element and the other capacitor element are electrically connected to each other by the embedded connection layer and the connection layer. As a result, the capacitor element and the other capacitor element function as one composite capacitor element. Furthermore, since the connection by the embedded connection layer and the connection layer is achieved by a serial connection, the sum of a dielectric strength of the capacitor element and a dielectric strength of the other capacitor element is a dielectric strength of the one composite capacitor element. Therefore, the dielectric strength is improved as compared to the case in which only the capacitor element is provided.

The following structure may be added to the semiconductor device in accordance with certain embodiments of the present invention. Namely, the semiconductor device may further comprise a first resistance element and a second resistance element, wherein the first resistance element and the second resistance element are located in the analog element region, and an impurity concentration of the first resistance element is higher than an impurity concentration of the second resistance element so that a resistance value of the first resistance element is lower than a resistance value of the second resistance element.

The following structure may be added to the semiconductor device in accordance with certain embodiments of the present invention. Namely, the semiconductor device may further comprise a first resistance element and a second resistance element, wherein the first resistance element and the second resistance element are located in the analog element region, and the first resistance element includes a silicide layer so that a resistance value of the first resistance element is lower than a resistance value of the second resistance element.

The following structure may be added to the semiconductor device in accordance with certain embodiments of the present invention. Namely, in accordance with certain embodiments of the present invention, a thickness of a dielectric layer of the capacitor element is the same as a thickness of a dielectric layer of the cell capacitor.

By the semiconductor device having the structure described above in accordance with certain embodiments of the present invention, the area of the capacitor element can be made smaller. More specifically, the charge capacity of a cell capacitor of a DRAM needs to be greater than a specified value so that the DRAM does not malfunction. For this reason, the thickness of a dielectric layer of the cell capacitor is very thin (for example, 5~10 nm). In accordance with certain embodiments of the present invention, the thickness of a dielectric layer of the capacitor element is the same as the thickness of a dielectric layer of the cell capacitor. As a result, even when the area of the capacitor element is small, the charge capacity that is required as a capacitor element can be securely maintained.

Accordingly, by the semiconductor device having the structure described above in accordance with certain embodiments of the present invention, since the area of the capacitor element can be made smaller, the semiconductor device can be further miniaturized.

Figure 15:
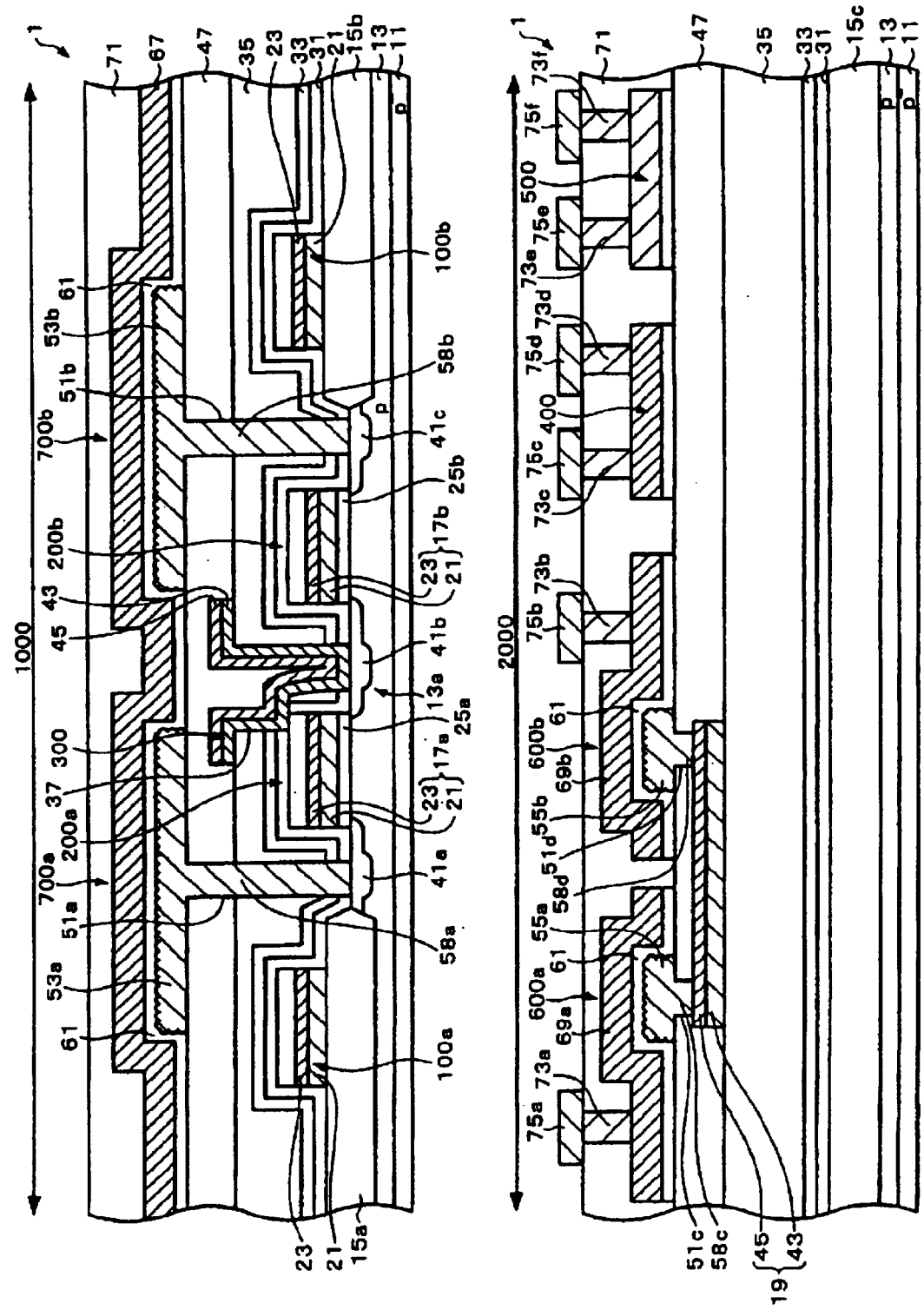
FIG. 15 schematically shows a cross section of a semiconductor device in accordance with the first embodiment of the present invention.

Preferred embodiments of the present invention will be described with reference to the accompanying drawings. FIG. 15 schematically shows a cross section of a semiconductor device in accordance with a first illustrated embodiment of the present invention. The semiconductor device 1 includes a DRAM region 1000 and an analog element region 2000.

The DRAM region 1000 includes word lines 100a and 100b, MOS (Metal Oxide Semiconductor) field effect transistors 200a and 200b, a bit line 300, and cell capacitors 700a and 700b. The MOS field effect transistor 200a and the cell capacitor 700a form one memory cell, and the MOS field effect transistor 200b and the cell capacitor 700b form one memory cell. The memory cells formed in the DRAM region 1000 form a DRAM macro cell of the DRAM mixed-mount type semiconductor device.

The analog element region 2000 includes a resistance element 400, a resistance element 500, capacitor elements 600a and 600b, and a variety of transistors (not shown in the figure). The resistance elements 400 and 500, the capacitor elements 600a and 600b, and the variety of transistors form an A/D converter that is one example of an analog circuit.

The semiconductor device 1 generally has the structure as described above. Next, a structure of the DRAM region 1000 is described in detail. Then, a structure of the analog element region 2000 will be described in detail.

A preferred structure of the DRAM region 1000 is as follows. A P type well 13 is formed in a P⁻ type silicon substrate 11. Field oxide layers 15a and 15b are selectively formed on the P type well 13. Among the P type well 13, a region that is defined by the field oxide layer 15a and the field oxide layer 15b defines an active region 13a. The MOS field effect transistors 200a and 200b are formed in the active region 13a. Also, the word line 100a is located over the field oxide layer 15a, and the word line 100b is located over the field oxide layer 15b.

First, the MOS field effect transistor 200a is described. The MOS field effect transistor 200a is equipped with a gate electrode (word line) 17a, an N⁺ type source/drain region 41a, and an N⁺ type source/drain region 41b. The N⁺ type source/drain region 41a and the N⁺ type source/drain region 41b are located on the surface of the active region 13a and spaced from each other. The gate electrode 17a is located through a gate oxide layer 25a over a region between the N⁺ type source/drain region 41a and the N⁺ type source/drain region 41b among the active region 13a. The gate electrode 17a has a structure having a polycrystal silicon layer 21 and a tungsten silicide layer 23 located thereon.

Next, the MOS field effect transistor 200b is described. The MOS field effect transistor 200b is equipped with a gate electrode (word line) 17b, an N⁺ type source/drain region 41b and an N⁺ type source/drain region 41c. The MOS field effect transistor 200a and the MOS field effect transistor 200b commonly use the N⁺ type source/drain region 41b. The N⁺ type source/drain region 41b and the N⁺ type source/drain region 41c are located on the surface of the active region 13a and spaced from each other. The gate electrode 17b is located through a gate oxide layer 25b over a region between the N⁺ type source/drain region 41b and the N⁺ type source/drain region 41c among the active region 13a. The gate electrode 17b has the same structure as that of the gate electrode 17a.

Next, the word lines 100a and 100b are described. Each of the word lines 100a and 100b has a structure having a polycrystal silicon layer 21 and a tungsten silicide layer 23 located thereon.

A TEOS layer 31, a silicon nitride layer 33 and an interlayer dielectric layer 35 are successively provided in this order from the bottom in a manner to cover the MOS field effect transistors 200a and 200b and the word lines 100a and 100b. The interlayer dielectric layer 35 may be formed from, for example, a silicon oxide layer. A contact hole 37 is formed in the above-described three layers. The contact hole 37 reaches the N⁺ type source/drain region 41b. The bit line 300 is located above the interlayer dielectric layer 35. The bit line 300 passes through the contact hole 37 and electrically connects to the N⁺ type source/drain region 41b. The bit line 300 has a structure including a polycrystal silicon layer 43 and a tungsten silicide layer 45 located thereon.

An interlayer dielectric layer 47 is located in a manner to cover the bit line 300. The interlayer dielectric layer 47 may be formed from, for example, a silicon oxide layer. Contact holes 51a and 51b are formed in the interlayer dielectric layer 47, the interlayer dielectric layer 35, the silicon nitride layer 33 and the TEOS layer 31. The contact hole 51a reaches the N⁺ type source/drain region 41a. Also, the contact hole 51b reaches the N⁺ type source/drain region 41c.

The cell capacitors 700a and 700b are located over the interlayer dielectric layer 47. First, the cell capacitor 700a is described. The cell capacitor 700a includes a storage node 53a, an ON layer 61 and a cell plate 67. The storage node 53a is located above the interlayer dielectric layer 47. The storage node 53a electrically connects to the N+ type source/ drain region 41a through an embedded connection layer 58a that is formed in the contact hole 51a. The storage node 53a and the embedded connection layer 58a are polycrystal silicon layers, and are integrally formed in one body. The ON layer 61 is located in a manner to cover the storage node 53a. The ON layer 61 is formed from a silicon oxide layer and a silicon nitride layer, and functions as a dielectric layer. The cell plate 67 is located in a manner to cover the ON layer 61. The cell plate 67 is a polycrystal silicon layer.

Next, the cell capacitor 700b is described. The cell capacitor 700b has a structure similar to that of the cell capacitor 700a. More specifically, the cell capacitor 700b includes a storage node 53b, an ON layer 61 and a cell plate 67. The storage node 53b is located above the interlayer dielectric layer 47. The storage node 53b electrically connects to the N+ type source/drain region 41c through an embedded connection layer 58b that is formed in the contact hole 51b. The storage node 53b and the embedded connection layer 58b are polycrystal silicon layers, and are integrally formed in one body. The ON layer 61 is located in a manner to cover the storage node 53b. The cell plate 67 is located in a manner to cover the ON layer 61.

An interlayer dielectric layer 71 is located in a manner to cover the capacitors 700a and 700b. The interlayer dielectric layer 71 may be formed from, for example, a silicon oxide layer. The detailed description of the structure of the DRAM region 1000 is completed.

A preferred structure of the analog element region 2000 is as follows. A P type well 13 is formed in a P− type silicon substrate 11. A field oxide layer 15c is selectively formed on the P type well 13. An interlayer dielectric layer 35 is formed in a manner to cover the field oxide layer 15c. A connection layer 19 is located above the interlayer dielectric layer 35. The connection layer 19 is used to electrically connect the capacitor element 600a and the capacitor element 600b. The connection layer 19 has a structure having a polycrystal silicon layer 43 and a tungsten silicide layer 45 located thereon. The connection layer 19 is located in the same layer where the bit line 300 is provided.

An interlayer dielectric layer 47 is located in a manner to cover the connection layer 19. The capacitor elements 600a and 600b and the resistance element 400 and the resistance element 500 are located above the interlayer dielectric layer 47.

First, the capacitor element 600a is described. The capacitor element 600a has a lower electrode 55a, an ON layer 61 and an upper electrode 69a. The lower electrode 55a is located above the interlayer dielectric layer 47. The lower electrode 55a connects to one end section of an embedded connection layer 58c that is formed in a contact hole 51c. The lower electrode 55a is connected to the embedded connection layer 58c at a bottom surface of the lower electrode 55a. The lower electrode 55a and the embedded connection layer 58c are polycrystal silicon layers, and integrally formed in one body. The other end section of the embedded connection layer 58c connects to the connection layer 19. The embedded connection layer 58c is used to electrically connect the capacitor element 600a and the capacitor element 600b. The ON layer 61 is located in a manner to cover the lower electrode 55a. The upper electrode 69a is located in a manner to cover the ON layer 61. The upper electrode 69a is a polycrystal silicon layer.

Next, the capacitor element 600b is described. The capacitor element 600b has a structure similar to that of the capacitor element 600a. More specifically, the capacitor element 600b has a lower electrode 55b, an ON layer 61 and an upper electrode 69b. The lower electrode 55b is located above the interlayer dielectric layer 47. The lower electrode 55b connects to one end section of an embedded connection layer 58d that is formed in a contact hole 51d. The lower electrode 55b is connected to the embedded connection layer 58d at a bottom surface of the lower electrode 55b. The lower electrode 55b and the embedded connection layer 58d are polycrystal silicon layers, and integrally formed in one body. The other end section of the embedded connection layer 58d connects to the connection layer 19. The embedded connection layer 58d is used to electrically connect the capacitor element 600a and the capacitor element 600b. The ON layer 61 is located in a manner to cover the lower electrode 55b. The upper electrode 69b is located in a manner to cover the ON layer 61. The upper electrode 69b is a polycrystal silicon layer.

As described above, the capacitor element 600a and the capacitor element 600b are serially connected to each other by the embedded connection layer 58c, the connection layer 19 and the embedded connection layer 58d.

Next, the resistance elements 400 and 500 are described. The resistance elements 400 and 500 are located above the interlayer dielectric layer 47. The resistance value of the resistance element 400 is lower than the resistance value of the resistance element 500. The resistance value of the resistance element 400 is, for example, 200~300 Ω. The resistance value of the resistance element 500 is, for example, 1~10 kΩ.

An interlayer dielectric layer 71 is located in a manner to cover the resistance element 400, the resistance element 500, and the capacitor elements 600a and 600b. A plurality of through holes are formed in the interlayer dielectric layer 71. Tungsten plugs 73a~73f are filled in the through holes.

Wirings such as, for example, aluminum wirings 75a ~75f are located above the interlayer dielectric layer 71. The aluminum wiring 75a electrically connects to the upper electrode 69a through the tungsten plug 73a. The aluminum wiring 75b electrically connects to the upper electrode 69b through the tungsten plug 73b. The aluminum wiring 75c electrically connects to one end section of the resistance element 400 through the tungsten plug 73c. The aluminum wiring 75d electrically connects to the other end section of the resistance element 400 through the tungsten plug 73d. The aluminum wiring 75e electrically connects to one end section of the resistance element 500 through the tungsten plug 73e. The aluminum wiring 75f electrically connects to the other end section of the resistance element 500 through the tungsten plug 73f.

It is noted that, since the capacitor elements 600a and 600b in the analog element region 2000 and the cell capacitors 700a and 700b in the DRAM region 1000 are simultaneously formed, the layers composing them have the same thickness. More specifically, the thickness of the lower electrodes 55a and 55b of the capacitor elements 600a and 600b (which is, for example, 100~1000 nm) is the same as the thickness of the storage nodes 53a and 53b of the cell capacitors 700a and 700b. Also, the thickness of the ON layer 61 of the capacitor elements 600a and 600b (which is, for example, 5~10 nm) is the same as the thickness of the ON layer 61 of the cell capacitors 700a and 700b. Also, the thickness of the upper electrodes 69a and 69b of the capacitor elements 600a and 600b (which is, for example, 50~200 nm) is the same as the thickness of the cell plate 67 of the cell capacitors 700a and 700b.

The detailed description of the structure of the analog element region 2000 is now completed. In accordance with the semiconductor device 1, the following effects are preferably created.

First, by the semiconductor device 1, an area of each of the capacitor elements 600a and 600b can be made smaller. More specifically, the charge capacity of each of the cell capacitors 700a and 700b of the DRAM needs to be greater than a specified value so that the DRAM does not malfunction. For this purpose, the thickness of a dielectric layer (ON layer 61) of each of the cell capacitors 700a and 700b is very thin (for example, 5~10 nm). In accordance with this embodiment of the present invention, the thickness of the dielectric layer (ON layer 61) of each of the capacitor elements 600a and 600b is the same as the thickness of the dielectric layer (ON layer 61) of each of the cell capacitors 700a and 700b, and therefore it is extremely thin. As a result, even when the area of each of the capacitor elements 600a and 600b is small, the charge capacity that is required as the capacitor elements 600a and 600b can be securely maintained.

In this manner, in accordance with the semiconductor device 1, since the area of each of the capacitor elements 600a and 600b can be made small, the semiconductor device 1 can be further miniaturized.

Second, in accordance with the semiconductor device 1, the lower electrodes 55a and 55b are respectively connected to the embedded connection layers 58c and 58d at the bottom surfaces of the lower electrodes 55a and 55b. Accordingly, the entire side surface of each of the lower electrodes 55a and 55b can be faced with each of the upper electrodes 69a and 69b, and therefore the area of each of the capacitor elements 600a and 600b can be reduced, accordingly. Therefore, in accordance with the semiconductor device 1, semiconductor devices can be further miniaturized.

Third, by the semiconductor device 1, the problem in which noises are transmitted to the capacitor elements 600a and 600b becomes difficult to occur. More specifically, when the connection layer that electrically connects the capacitor element 600a and the capacitor element 600b is defined by, for example, an impurity region formed in the semiconductor substrate, electric charges may flow from a well that connects to the impurity region to the capacitor elements 600a and 600b. This may cause malfunctions of circuits that include the capacitor elements 600a and 600b. In contrast, in accordance with the semiconductor device 1, the connection layer 19 is provided in the same layer in which the bit line 300 of the DRAM is provided. As a result, the problem of noise transmission becomes difficult to occur.

Fourth, in accordance with the semiconductor device 1, the capacitor element 600a and the capacitor element 600b are electrically connected to each other by the embedded connection layer 58c, the connection layer 19 and the embedded connection layer 58d. As a result, the capacitor element 600a and the capacitor element 600b function as one composite capacitor element. Furthermore, since the connection by the embedded connection layer 58c, the connection layer 19 and the embedded connection layer 58d is provided by a serial connection, the sum of a dielectric strength of the capacitor element 600a and a dielectric strength of the capacitor element 600b is a dielectric strength of the one composite capacitor element described above. Therefore, the dielectric strength is improved as compared to the case in which only the capacitor element 600a (or the capacitor element 600b) is provided.

A method for manufacturing the semiconductor device 1 shown in FIG. 15 in accordance with an embodiment of the present invention is described with reference to FIGS. 1 through 14. FIGS. 1 through 14 show steps of the method for manufacturing the semiconductor device 1.

First, steps of forming gate electrodes 17a and 17b and word lines 100a and 100b shown in FIG. 15 are described with reference to FIGS. 1 and 2.

As shown in FIG. 1, field oxide layers 15a, 15b and 15c are formed on the surface of a P⁻ type semiconductor substrate 11 by, for example, a selective oxide method. The field oxide layers 15a and 15b are formed in the DRAM region 1000. The field oxide layer 15c is formed in the analog element region 2000.

Next, a p-type impurity (for example, boron) is ion-implanted in the surface of the P⁻ type semiconductor substrate 11, to thereby form a P type well 13 in the P⁻ type semiconductor substrate 11. Among the P type well 13, a region that is defined by the field oxide layer 15a and another field oxide layer 15b becomes an active region 13a.

Figure 2:
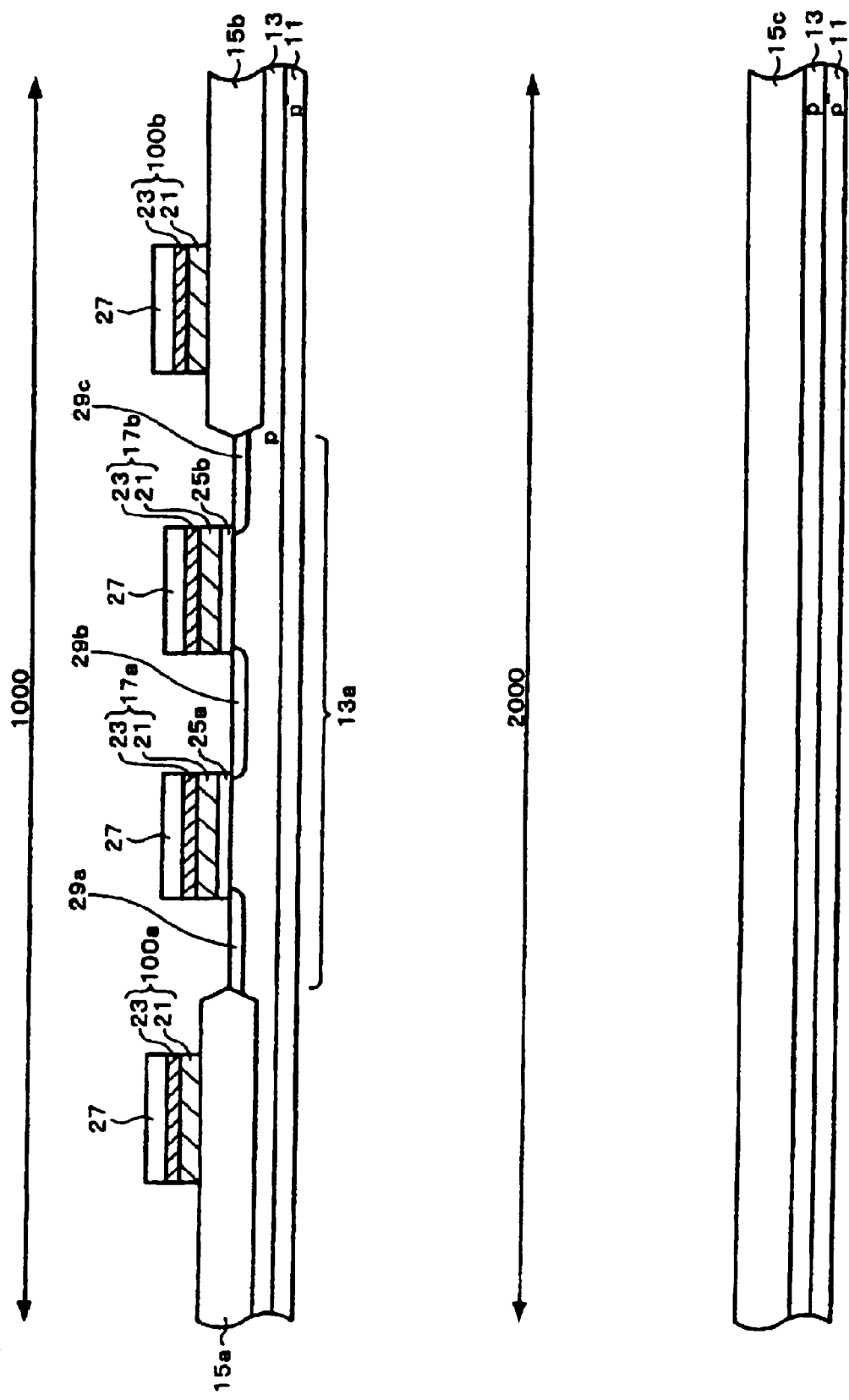
FIG. 2 schematically shows a cross section of the silicon substrate, which is used to describe a method for manufacturing a semiconductor device in accordance with the first embodiment of the present invention.

As shown in FIG. 2, the P⁻ type semiconductor substrate 11 is, for example, thermally oxidized to form a thermal oxide layer that becomes gate oxide layers 25a and 25b over the active regions 13a. Then, a doped amorphous silicon layer is formed on the thermal oxide layer by using, for example, a CVD method. The doped amorphous silicon layer becomes components of gate electrodes and the like. The doped amorphous silicon layer becomes a polycrystal silicon layer 21 in a heat treatment conducted during the manufacturing process. Then, a tungsten silicide layer 23 is formed over the doped amorphous silicon layer by using, for example, a CVD method. Next, a silicon oxide layer 27 that becomes a cap layer is formed over the tungsten silicide layer 23 by, for example, a CVD method.

A structure having the thermal oxide layer, the doped amorphous silicon layer, the tungsten silicide layer 23 and the silicon oxide layer 27 is subject to a specified patterning by, for example, photolithography and etching. As a result, word lines 100a and 100b and gate electrodes 17a and 17b are formed in the DRAM region 1000.

Next, an N type impurity (for example, phosphorous) is ion-implanted in the active region 13a, using the gate electrodes 17a and 17b as masks, to thereby form N⁻ type impurity regions 29a, 29b and 29c.

Steps of forming a bit line 300 and a connection layer 19 shown in FIG. 15 are described with reference to FIGS. 3 through 5.

Figure 3:
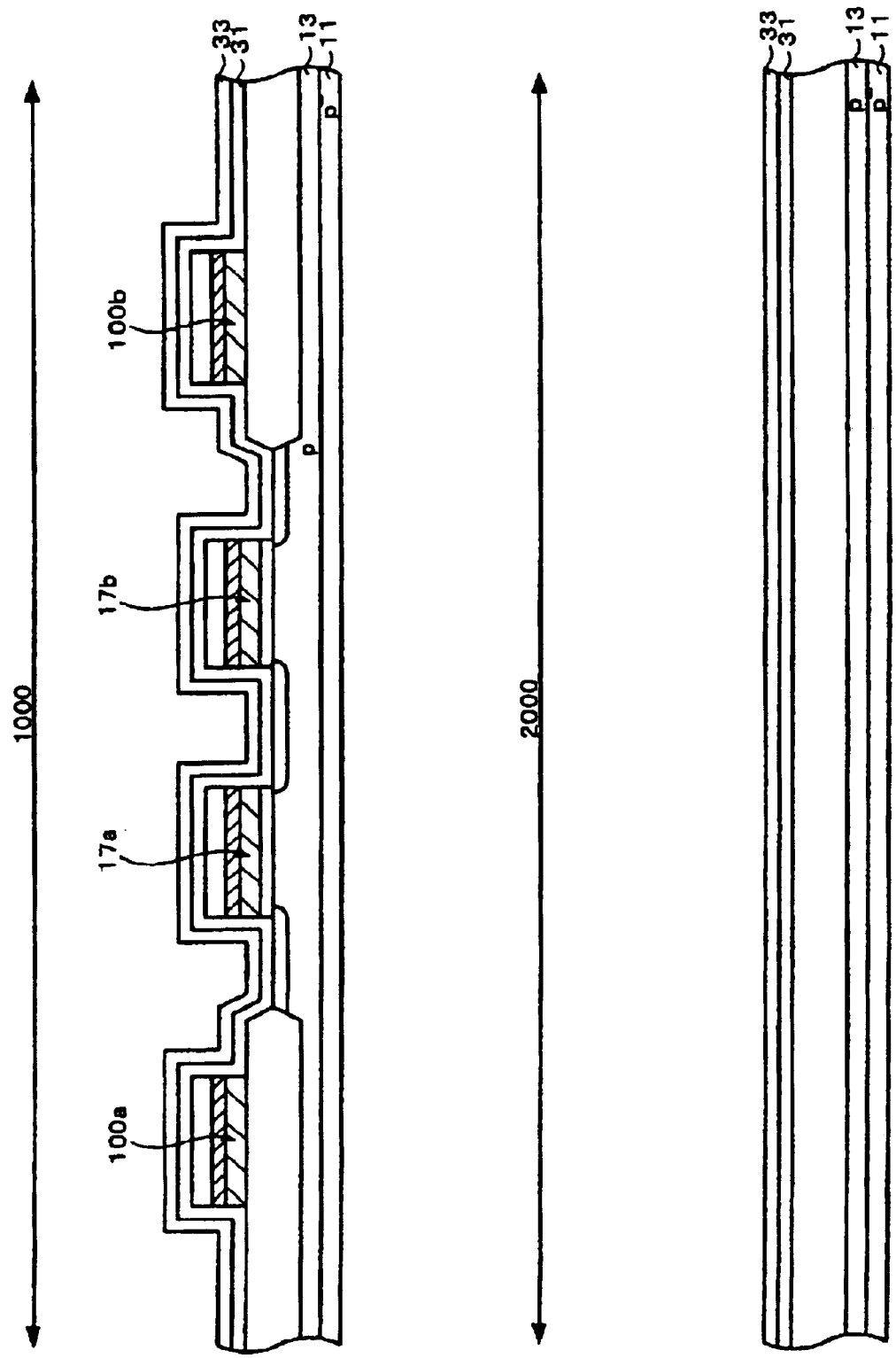
FIG. 3 schematically shows a cross section of the silicon substrate, which is used to describe a method for manufacturing a semiconductor device in accordance with the first embodiment of the present invention.

As shown in FIG. 3, a TEOS layer 31 is formed in a manner to cover the P⁻ type semiconductor substrate 11 by, for example, a CVD method. Then, a silicon nitride layer 33 is formed over the TEOS layer 31 by, for example, a CVD method. The TEOS layer 31 and the silicon nitride layer 33 function as an etching stopper in the succeeding step, i.e., the step of forming a contact hole.

Figure 4:
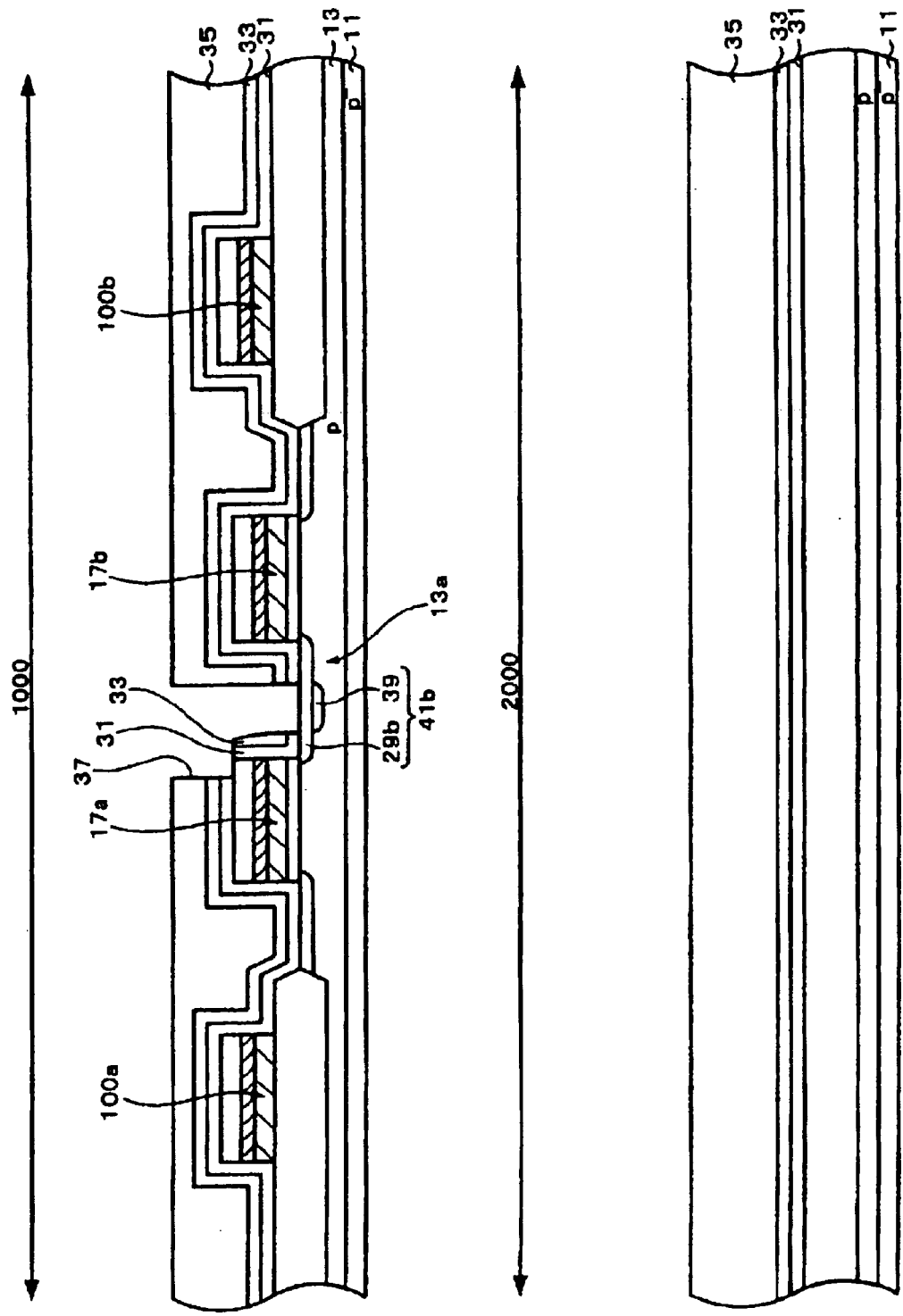
FIG. 4 schematically shows a cross section of the silicon substrate, which is used to describe a method for manufacturing a semiconductor device in accordance with the first embodiment of the present invention.

As shown in FIG. 4, an interlayer dielectric layer 35 that is composed of a silicon oxide layer is formed over the silicon nitride layer 33 by, for example, a CVD method. Then, a resist is formed over the interlayer dielectric layer 35. A layer composed of the interlayer dielectric layer 35, the silicon nitride layer 33 and the TEOS layer 31 is selectively etched, using the resist as a mask, to form a contact hole 37 that reaches the N⁻ type impurity region 29b. The step of forming the contact hole 37 is described in detail below.

In the step of forming the contact hole 37, first, the interlayer dielectric layer 35 is etched with the resist functioning as a mask. In this etching step, the silicon nitride layer 33 functions as an etching stopper. Then, the silicon nitride layer 33 is etched. In this etching step, the TEOS layer 31 functions as an etching stopper. Then, lastly, the TEOS layer 31 is etched. By the steps described above, the contact hole 37 is formed in a self-alignment manner. By forming the contact hole 37 in this manner, the gate electrode 17a can be prevented from being exposed through the contact hole 37.

Then, an N type impurity (for example, phosphorous) is ion-implanted in the active region 13a, using the interlayer dielectric layer 35 as a mask, to form an $N^+$ type impurity region 39. The $N^+$ type impurity region 39 and the $N^-$ type impurity region 29b form an $N^+$ type source/drain region 41b.

Figure 5:
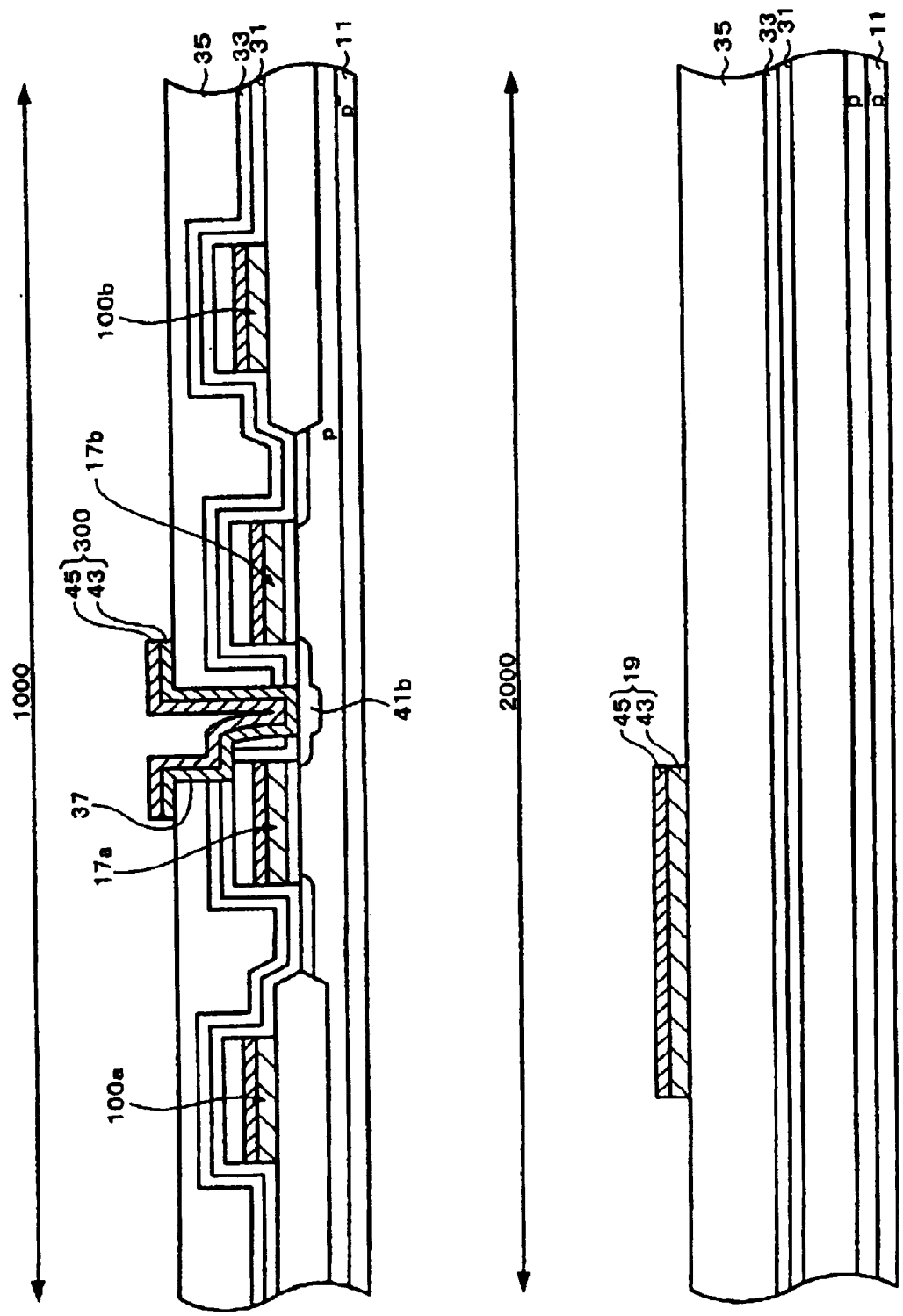
FIG. 5 schematically shows a cross section of the silicon substrate, which is used to describe a method for manufacturing a semiconductor device in accordance with the first embodiment of the present invention.

As shown in FIG. 5, a doped amorphous silicon layer is formed on the interlayer dielectric layer 35 by using, for example, a CVD method. The doped amorphous silicon layer becomes a silicon layer 43 that is a component of the bit line 300 and a component of the connection layer 19. The doped amorphous silicon layer becomes a polycrystal silicon layer 43 in a heat treatment conducted during the manufacturing process. Then, a tungsten silicide layer 45 is formed over the doped amorphous silicon layer by using, for example, a CVD method. A structure composed of the doped amorphous silicon layer and the tungsten silicide layer 45 is subject to a specified patterning by, for example, photolithography and etching. As a result, a bit line 300 is formed in the DRAM region 1000, and a connection layer 19 is formed in the analog element region 2000. The bit line 300 is also formed on the inside of the contact hole 37 and electrically connects to the $N^+$ type source/drain region 41b.

Steps of forming storage nodes 53a and 53b and lower electrodes 55a and 55b shown in FIG. 15 are described with reference to FIGS. 6 and 7.

Figure 6:
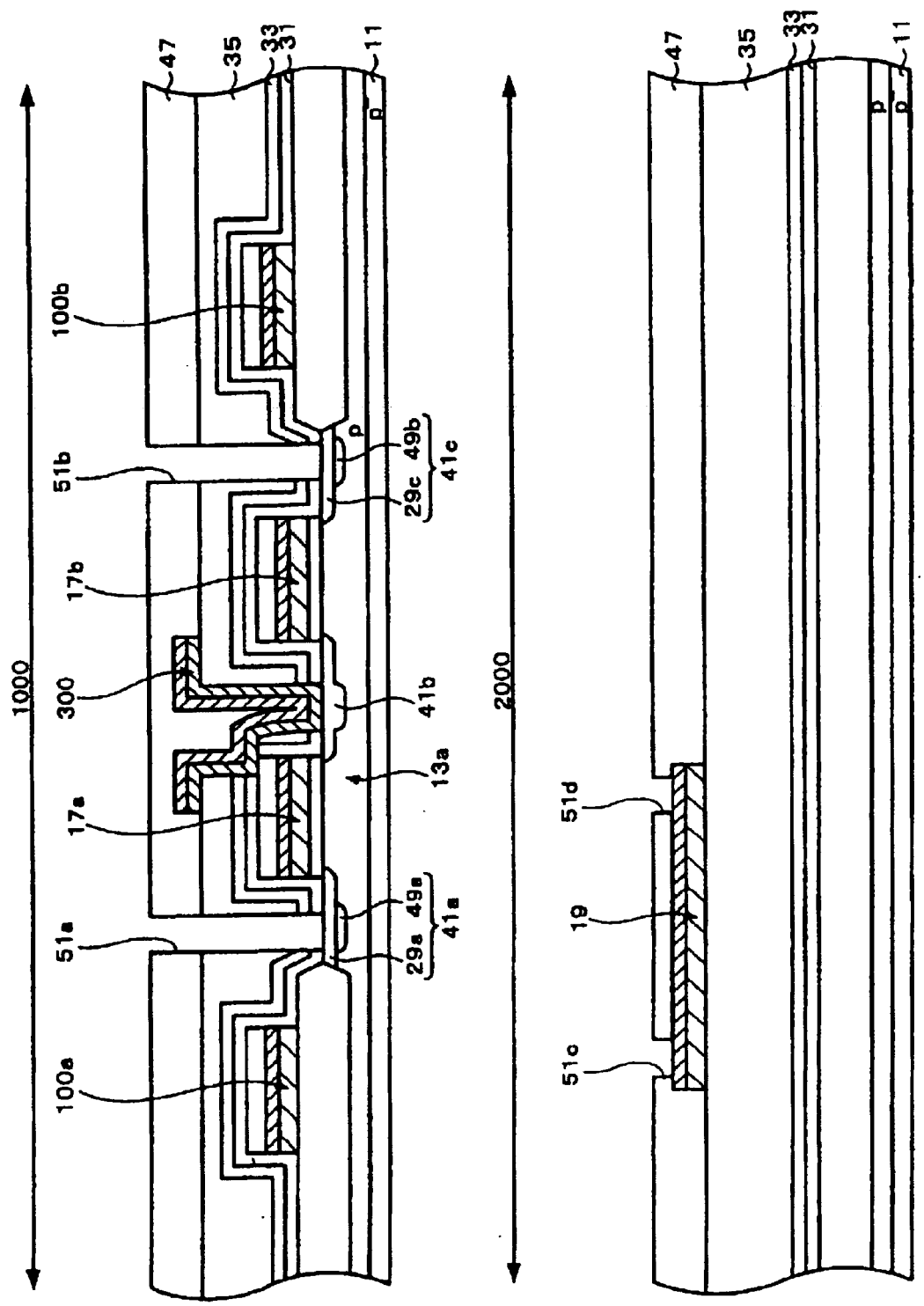
FIG. 6 schematically shows a cross section of the silicon substrate, which is used to describe a method for manufacturing a semiconductor device in accordance with the first embodiment of the present invention.

As shown in FIG. 6, an interlayer dielectric layer 47 that is composed of a silicon oxide layer is formed over the surface of the $P^-$ type semiconductor substrate 11 in a manner to cover the bit line 300 by, for example, a CVD method. Then, a resist is formed over the interlayer dielectric layer 47. A layer composed of the interlayer dielectric layers 47 and 35, the silicon nitride layer 33 and the TEOS layer 31 is selectively etched, using the resist as a mask, to form contact holes 51a~51d. The contact hole 51a reaches the $N^-$ type impurity region 29a. The contact hole 51b reaches the $N^-$ type impurity region 29c. The contact hole 51c reaches one end section of the connection layer 19. The contact hole 51d reaches the other end section of the connection layer 19.

Then, an N type impurity (for example, phosphorous) is ion-implanted in the active region 13a, using the interlayer dielectric layer 47 as a mask, to form $N^+$ type impurity regions 49a and 49b. The $N^+$ type impurity region 49a and the $N^-$ type impurity region 29a form an $N^+$ type source/drain region 41a. The $N^+$ type impurity region 49b and the $N^-$ type impurity region 29c form an $N^+$ type source/drain region 41c.

Figure 7:
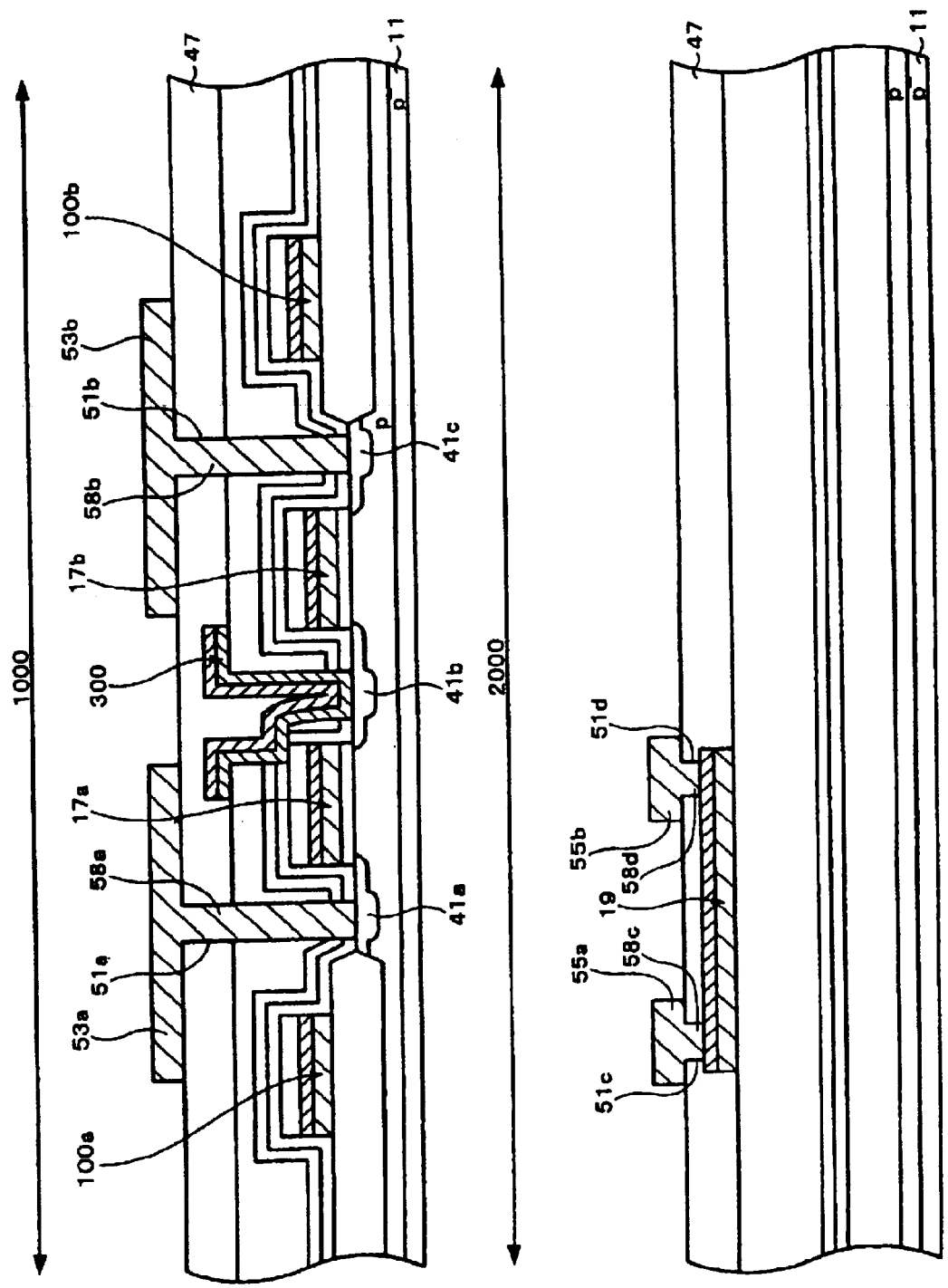
FIG. 7 schematically shows a cross section of the silicon substrate, which is used to describe a method for manufacturing a semiconductor device in accordance with the first embodiment of the present invention.

As shown in FIG. 7, a doped amorphous silicon layer is formed over the interlayer dielectric layer 47 and on the inside of the contact holes 51a~51d by, for example, a CVD method. The doped amorphous silicon layer over the interlayer dielectric layer 47 becomes storage nodes and lower electrodes. The doped amorphous silicon layer inside the contact holes 51a~51d becomes embedded connection layers 58a~58d. In this manner, the storage nodes and the embedded connection layers connecting thereto are integrally formed, and the lower electrodes and the embedded connection layers connecting thereto are integrally formed. The doped amorphous silicon layer becomes a polycrystal silicon layer in a heat treatment conducted during the manufacturing process.

Next, the doped amorphous silicon layer is subject to a specified patterning by, for example, photolithography and etching. As a result, storage nodes 53a and 53b are formed in the DRAM region 1000. Also, lower electrodes 55a and 55b are formed in the analog element region 2000.

Steps for forming roughened surfaces on the storage nodes 53a and 53b and the lower electrodes 55a and 55b shown in FIG. 15 are described with reference to FIGS. 8 and 9. The surfaces of the storage nodes 53a and 53b and the lower electrodes 55a and 55b are preferably roughened to increase the surface area and to thereby increase the storage capacity.

Figure 8:
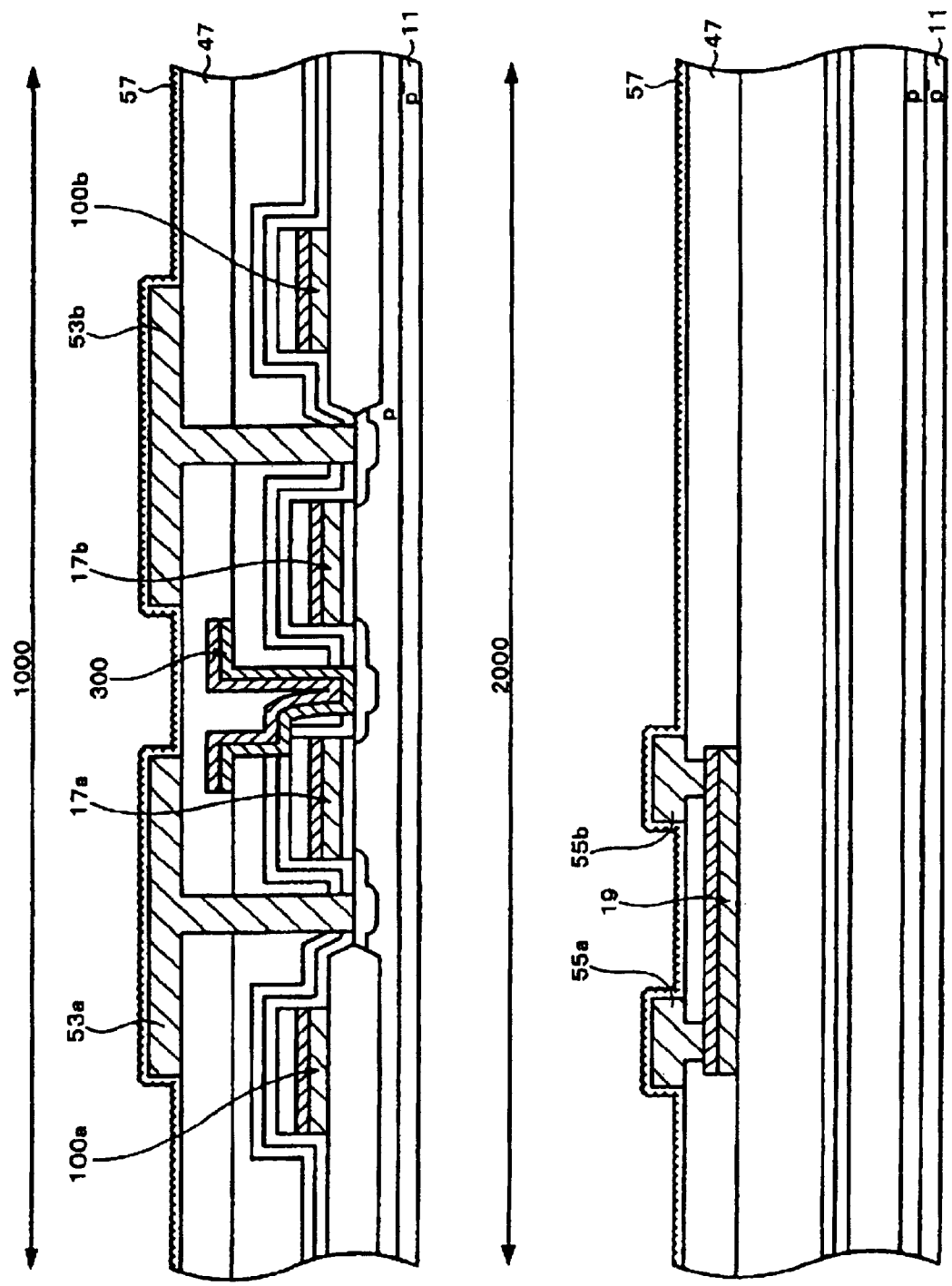
FIG. 8 schematically shows a cross section of the silicon substrate, which is used to describe a method for manufacturing a semiconductor device in accordance with the first embodiment of the present invention.

As shown in FIG. 8, an amorphous silicon layer 57 having a rough surface is formed over the surface of the $P^-$ type silicon substrate 11 in a manner to cover the storage nodes 53a and 53b and the lower electrodes 55a and 55b. This surface treatment is well known, and therefore its description is omitted in the present specification.

Figure 9:
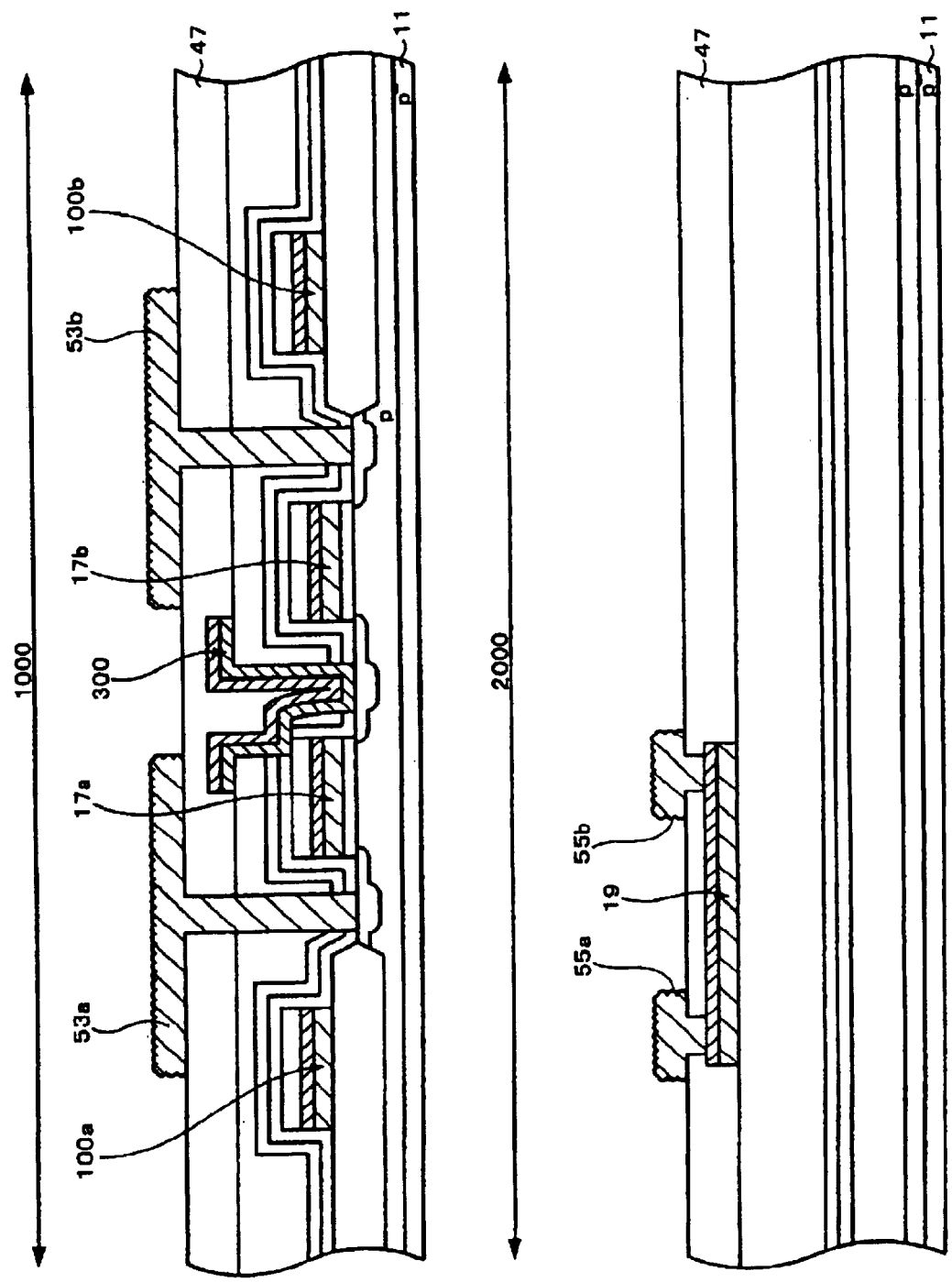
FIG. 9 schematically shows a cross section of the silicon substrate, which is used to describe a method for manufacturing a semiconductor device in accordance with the first embodiment of the present invention.

As shown in FIG. 9, the surface of the amorphous silicon layer 57 is etched back, to thereby remove the amorphous silicon layer 57 on the interlayer dielectric layer 47. This is required to prevent a short circuit between the storage node 53a and storage node 53b, and also to prevent a short circuit between the lower electrode 55a and lower electrode 55b. As the etching back step is conducted, the roughness of the surface of the amorphous silicon layer 57 are directly reflected on the surfaces of the storage nodes 53a and 53b and on the surfaces of the lower electrodes 55a and 55b. As a result, the roughness is formed on the surfaces of the storage nodes 53a and 53b and on the surfaces of the lower electrodes 55a and 55b.

Steps of forming a cell plate 67, upper electrodes 69a and 69b, and resistance elements 400 and 500 shown in FIG. 15 are described with reference to FIGS. 10 through 14.

Figure 10:
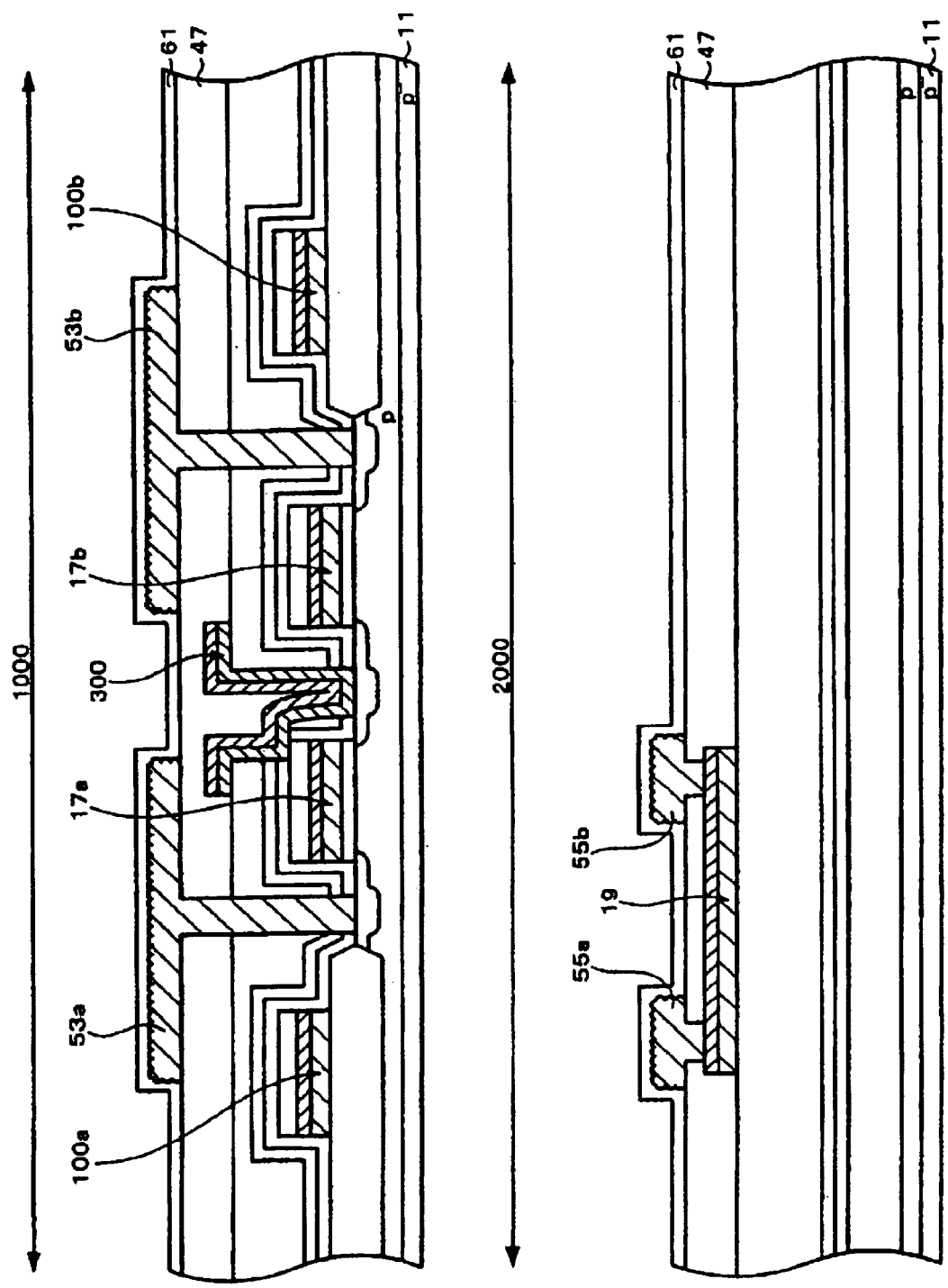
FIG. 10 schematically shows a cross section of the silicon substrate, which is used to describe a method for manufacturing a semiconductor device in accordance with the first embodiment of the present invention.

As shown in FIG. 10, a silicon nitride layer is formed over the surface of the $P^-$ type semiconductor substrate 11 in a manner to cover the storage nodes 53a and 53b and the lower electrodes 55a and 55b by, for example, a CVD method. The silicon nitride layer is thermally oxidized to form a silicon oxide layer on the surface of the silicon nitride layer, which define an ON layer 61.

Figure 11:
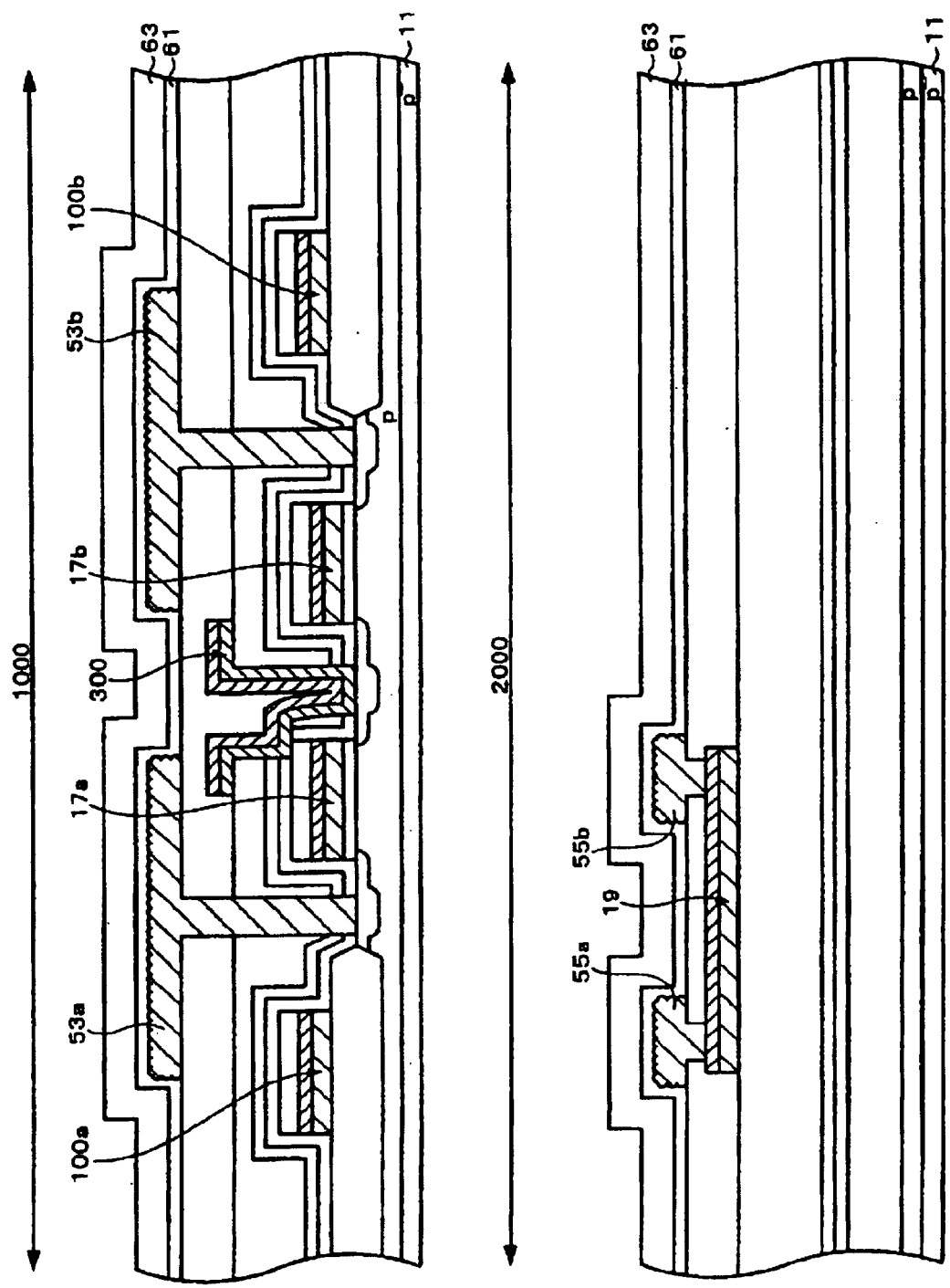
FIG. 11 schematically shows a cross section of the silicon substrate, which is used to describe a method for manufacturing a semiconductor device in accordance with the first embodiment of the present invention.

As shown in FIG. 11, a non-doped polycrystal silicon layer 63 is formed over the surface of the $P^-$ type semiconductor substrate 11 in a manner to cover the ON layer 61 by, for example, a CVD method.

Figure 12:
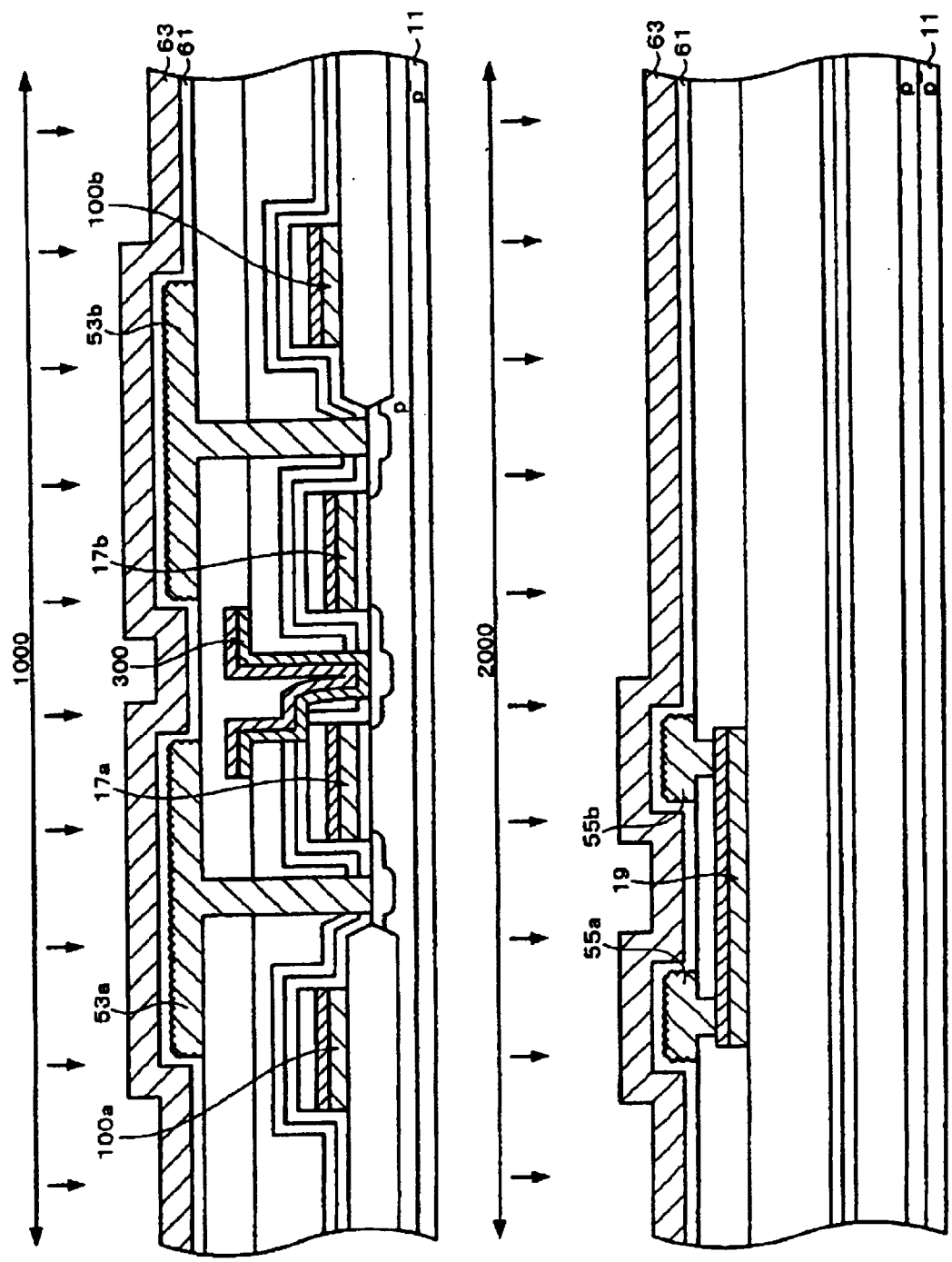
FIG. 12 schematically shows a cross section of the silicon substrate, which is used to describe a method for manufacturing a semiconductor device in accordance with the first embodiment of the present invention.

As shown in FIG. 12, a first ion-implantation is conducted. More specifically, an impurity (for example, phosphorous) is ion-implanted in the surface of the polycrystal silicon layer 63. The dose is 2e15~3e15. The implanting energy is 10~20 keV. These conditions are used to obtain a specified resistance value (for example, 1~10 k$\Omega$) of the resistance element 500 shown in FIG. 15.

Figure 13:
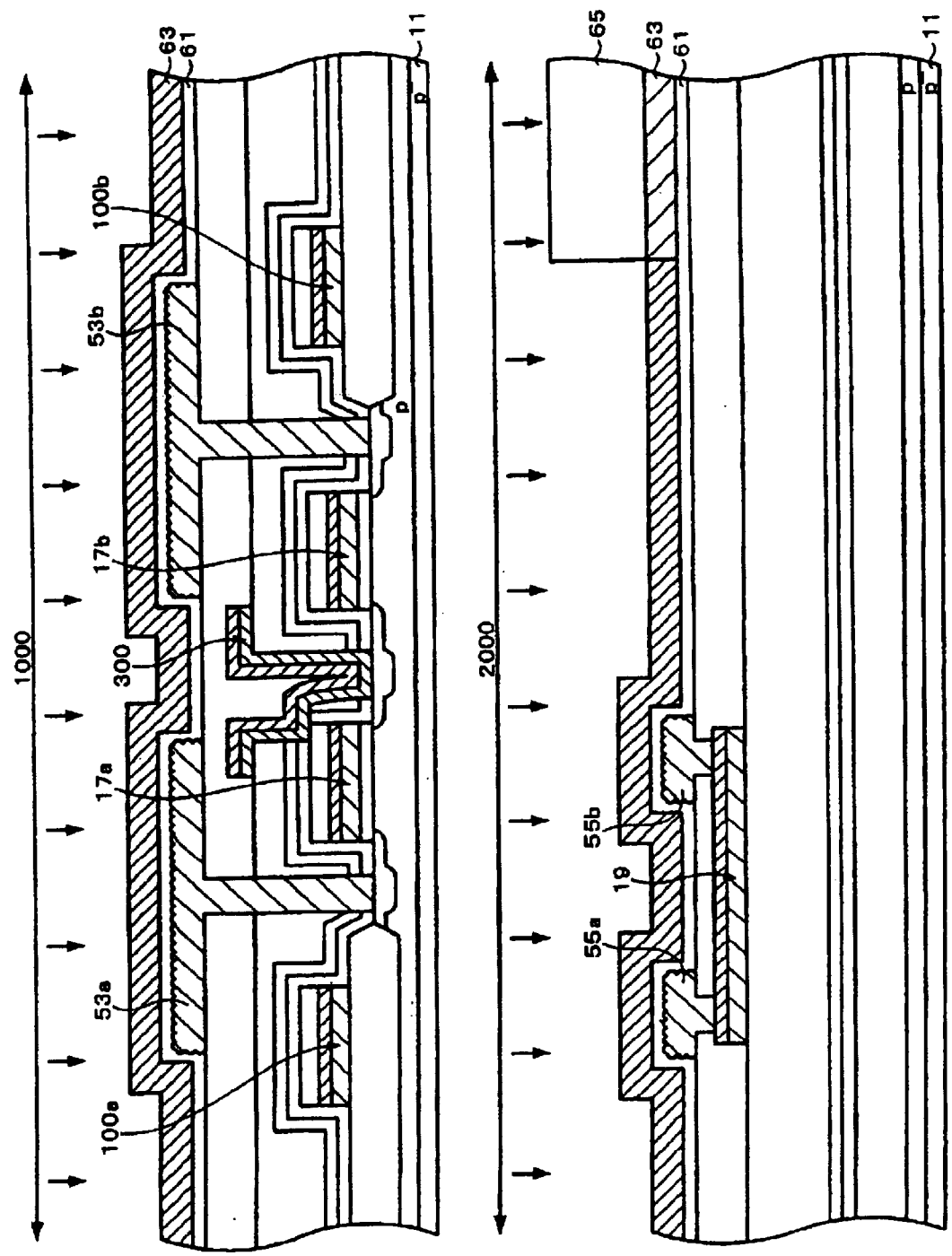
FIG. 13 schematically shows a cross section of the silicon substrate, which is used to describe a method for manufacturing a semiconductor device in accordance with the first embodiment of the present invention.

As shown in FIG. 13, a resist 65 is formed in a region on the polycrystal silicon layer 63 where the resistance element 500 shown in FIG. 15 is to be formed. Then, a second ion-implantation is conducted. More specifically, an impurity (for example, phosphorous) is ion-implanted in the polycrystal silicon layer 63, using the resist 65 as a mask. The dose is 5e15~8e15. The implanting energy is 10~20 keV. By the first and second ion-implantation steps, a specified resistance value (for example, 200~300 $\Omega$) of the resistance element 400 shown in FIG. 15 is obtained.

Figure 14:
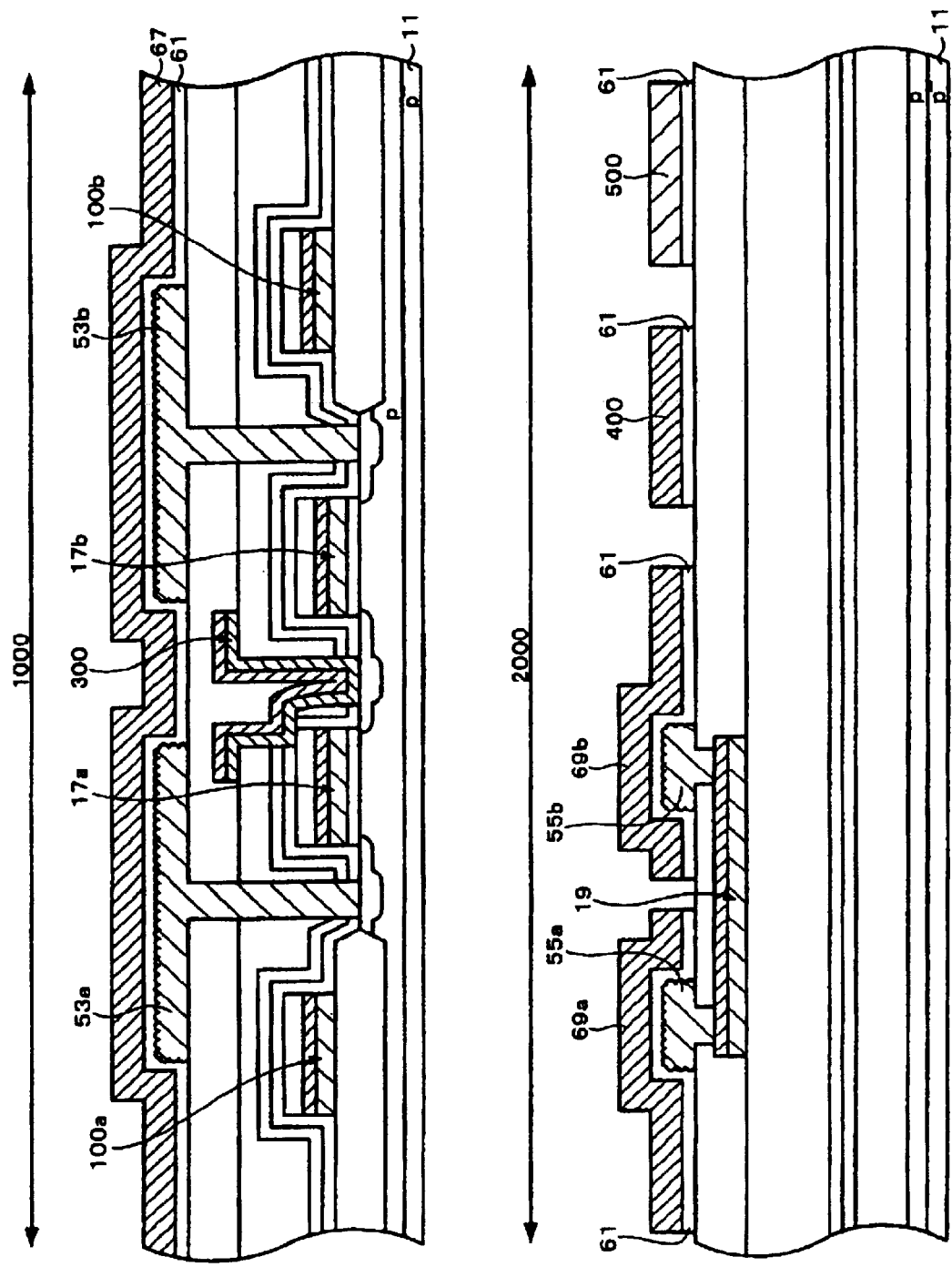
FIG. 14 schematically shows a cross section of the silicon substrate, which is used to describe a method for manufacturing a semiconductor device in accordance with the first embodiment of the present invention.

Then, the polycrystal silicon layer 63 is subject to a specified patterning by, for example, photolithography and etching. As a result, as shown in FIG. 14, a cell plate 67 is formed in the DRAM region 1000. Also, upper electrodes 69a and 69b, a resistance element 400 and a resistance element 500 are formed in the analog element region 200.

Steps of forming wirings such as, for example, aluminum wirings 75a~75f shown in FIG. 15 are described with reference to FIG. 15. These steps can be conducted by a know method, and therefore they are briefly described.

As shown in FIG. 15, an interlayer dielectric layer 71 that is composed of a silicon oxide layer is formed over the surface of the P⁻ type semiconductor substrate 11. A plurality of through holes are formed in the interlayer dielectric layer 71, and tungsten plugs 73a~73f are embedded in the respective through holes. Then, aluminum wirings 75a~75f are formed over the interlayer dielectric layer 71.

By the manufacturing steps described above, the semiconductor device 1 shown in FIG. 15 is completed. In accordance with the method for manufacturing the semiconductor device 1 as described in the above embodiment, the following effects are preferable created.

First, as shown in FIGS. 7 through 14, in accordance with the method for manufacturing the semiconductor device 1 in the embodiment described above, the cell capacitors 700a and 700b and the capacitor elements 600a and 600b are simultaneously formed. As a result, the manufacturing steps are simplified compared to the case where they are independently formed.

Second, as shown in FIG. 5, in accordance with the method for manufacturing the semiconductor device 1 in the embodiment described above, since the connection layer 19 is simultaneously formed with the bit line 300, the manufacturing steps are simplified.

Third, as shown in FIG. 12 and FIG. 13, in accordance with the method for manufacturing the semiconductor device 1 in the embodiment described above, the ion-implantation for forming the resistance element 400 is conducted two times, and the ion-implantation for forming the resistance element 500 is conducted one time, to lower the resistance value of the resistance element 400 than the resistance value of the resistance element 500. Therefore, in accordance with the method for manufacturing the semiconductor device 1, the resistance elements 400 and 500 having different resistance values can be formed.

Figure 18:
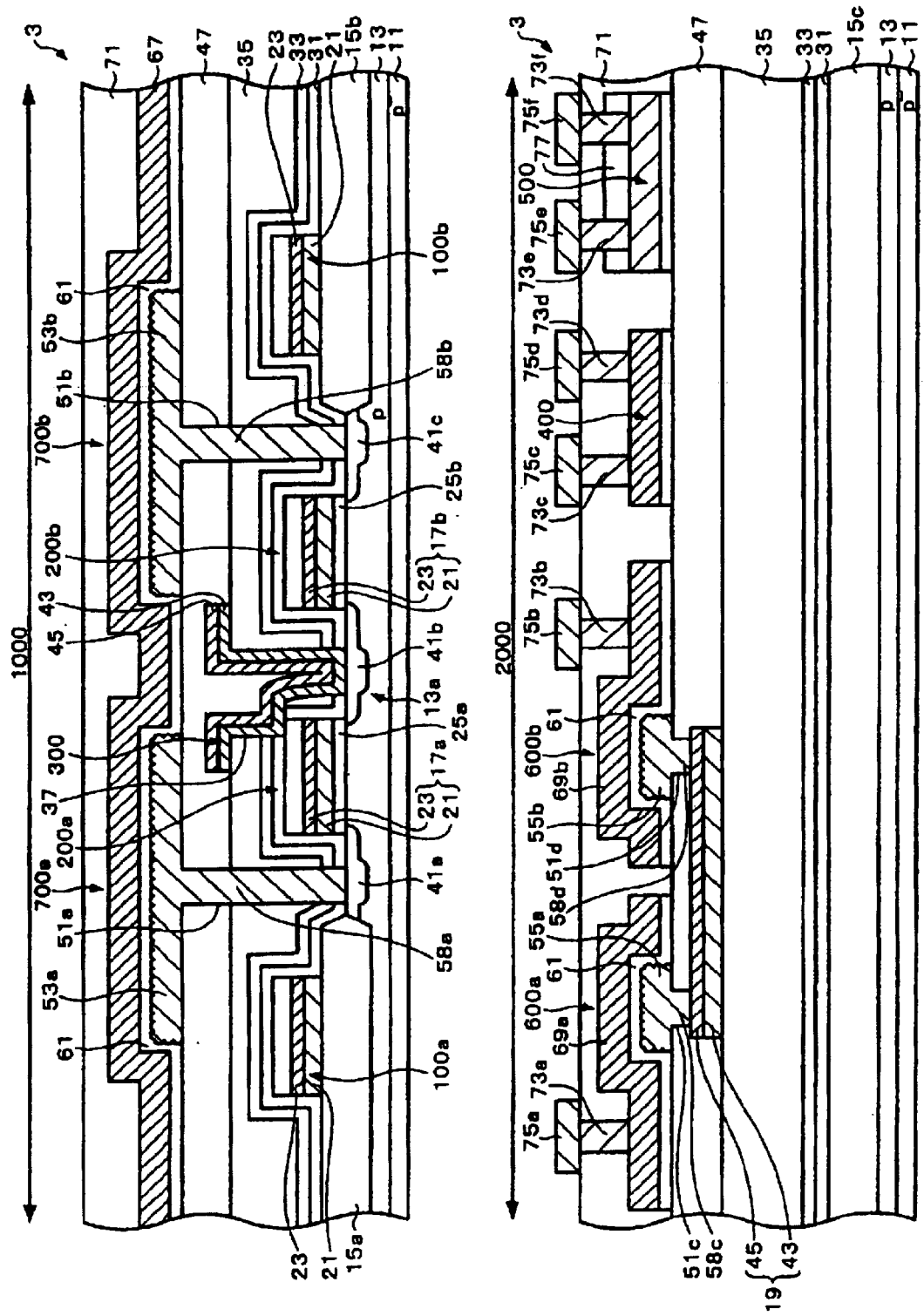
FIG. 18 schematically shows a cross section of a semiconductor device in accordance with the second embodiment of the present invention.

FIG. 18 schematically shows a cross section of a semiconductor device in accordance with a second illustrated embodiment of the present invention. The semiconductor device 3 in accordance with the second embodiment is similar to the first embodiment shown in FIG. 15, and is a DRAM mixed-mount type semiconductor device. The same reference numerals are used for elements of the semiconductor device 3 of the second embodiment, which have functions equivalent to those of the semiconductor device 1 of the first embodiment. Portions of the semiconductor device 3 different from the semiconductor device 1 are described, and the description of the equivalent portions is omitted.

In the semiconductor device 3, a resistance element 400 has a resistance value of, for example, 10~100 Ω, and its minimum resistance value is smaller than that of the resistance element 400 of the semiconductor device 1 in accordance with the first embodiment. This is because the resistance element 400 of the semiconductor device 3 in accordance with the second embodiment is formed by ion-implantation and diffusion.

In the semiconductor device 3, a silicon oxide layer 77 is located over a resistance element 500. The silicon oxide layer 77 is used as a mask in the diffusion step. The detail thereof is described below in connection with a device manufacturing method.

By the semiconductor device 3, the four effects described above in connection with the semiconductor device 1 in accordance with the first embodiment are preferably created.

Figure 16:
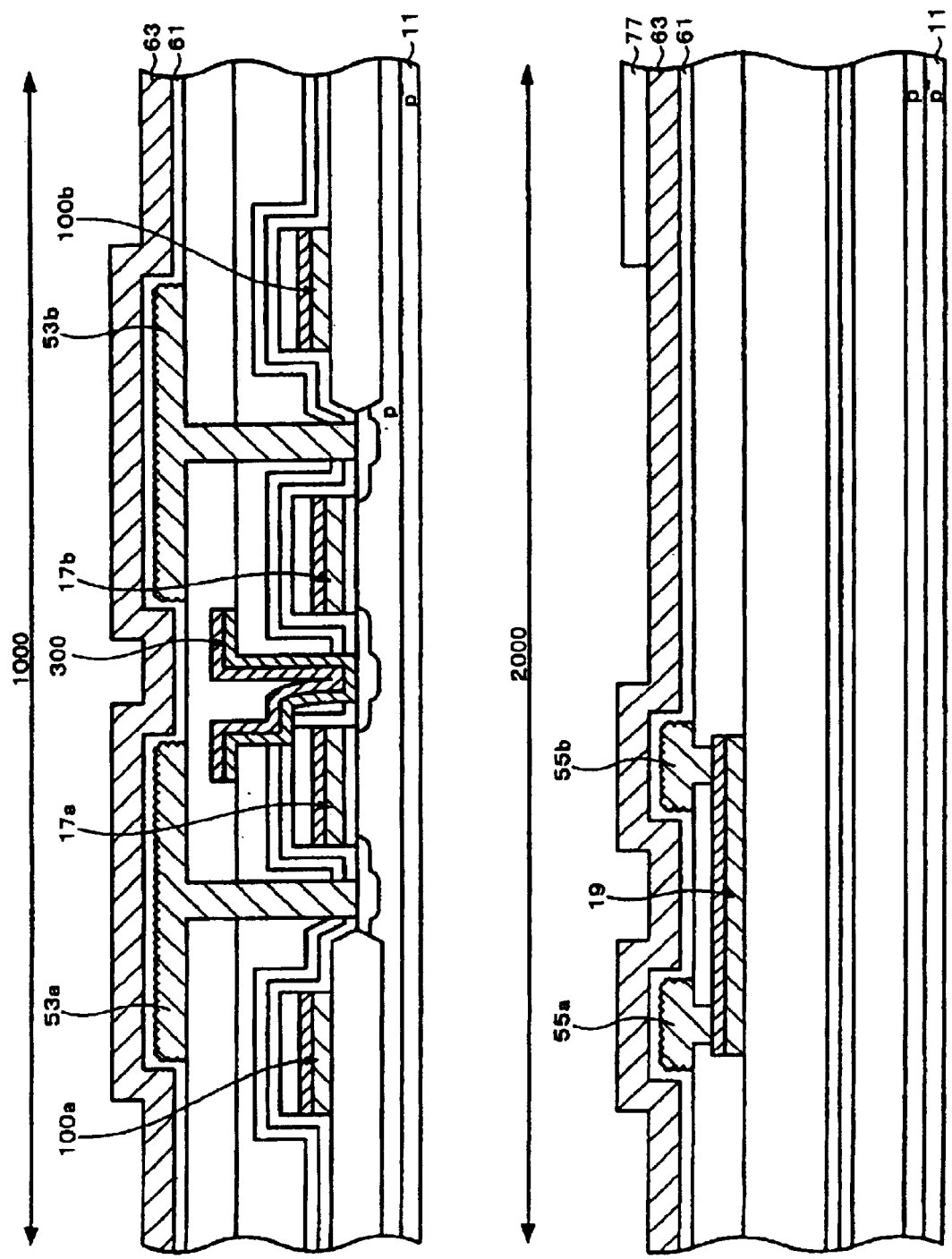
FIG. 16 schematically shows a cross section of a silicon substrate, which is used to describe a method for manufacturing a semiconductor device in accordance with a second embodiment of the present invention.
Figure 17:
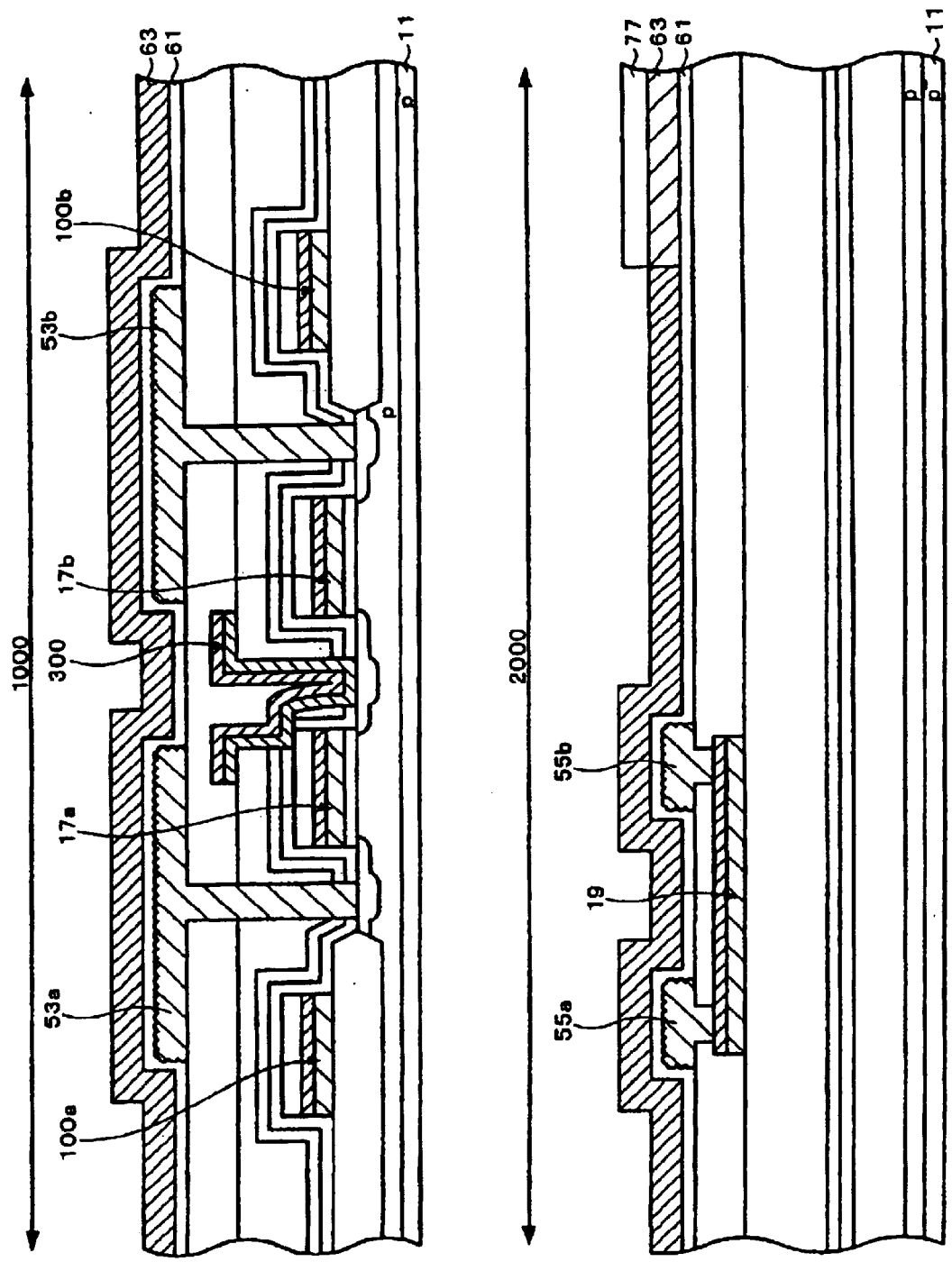
FIG. 17 schematically shows a cross section of the silicon substrate, which is used to describe a method for manufacturing a semiconductor device in accordance with the second embodiment of the present invention.

A method for manufacturing the semiconductor device 3 shown in FIG. 18 in accordance with an embodiment of the present invention is described with reference to FIGS. 16 and 17. FIGS. 16 and 17 show steps in the method for manufacturing the semiconductor device 3.

First, the steps shown in FIGS. 1 through 12 are conducted in a similar manner as for manufacturing the semiconductor device 1 as described above.

As shown in FIG. 16, a silicon oxide layer 77 is formed over a polycrystal silicon layer 63 by, for example, a CVD method. Then, the silicon oxide layer 77 is patterned by, for example photolithography and etching. As a result, the silicon oxide layer 77 is left over a region of the polycrystal silicon layer 63 where the resistance element 500 shown in FIG. 18 is to be formed.

As shown in FIG. 17, a diffusion step is conducted. More specifically, the silicon substrate 11 is placed in a diffusion furnace, and an impurity (for example, phosphorous) is thermally diffused in the polycrystal silicon layer 63, using the silicon oxide layer 77 as a mask. Its conditions are as follows.

Impurity: POCl₃

Diffusion temperature: 800~900° C.

Diffusion time: 15~30 minutes

By the ion-implantation step and the diffusion step shown in FIG. 12, a specified resistance value (for example, 10~100 Ω) of the resistance element 400 shown in FIG. 18 is obtained.

Succeeding steps are the same as those of the method for manufacturing the semiconductor device 1 as described above, and therefore the description thereof is omitted.

By the method for manufacturing the semiconductor device 3 the first and second effects described above in connection with the semiconductor device 1 of the first embodiment are preferably created.

Furthermore, in accordance with the method for manufacturing the semiconductor device 3, the resistance elements 400 and 500 having different resistance values can be formed, and the minimum resistance value of the resistance element 400 can be lowered.

Figure 21:
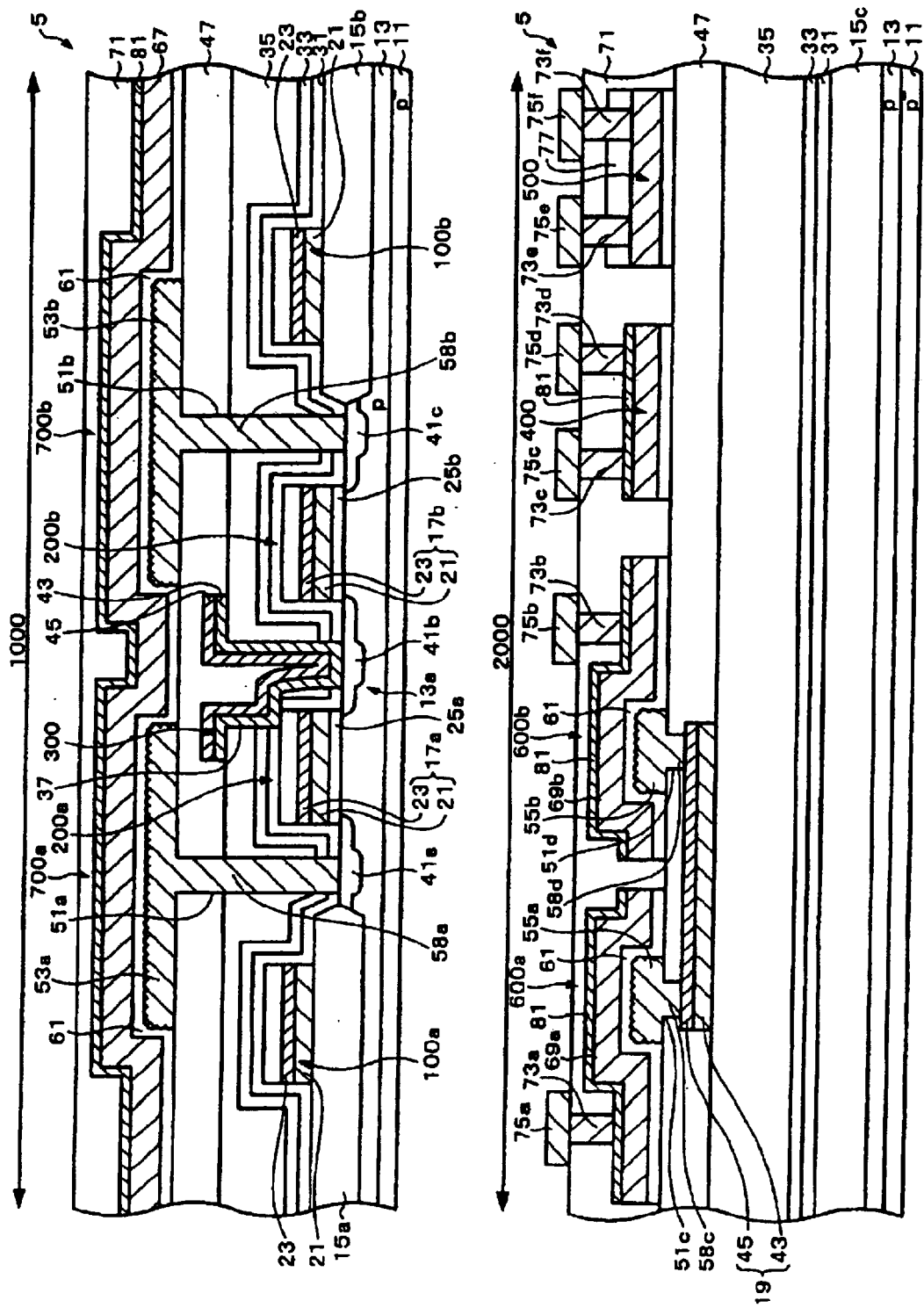
FIG. 21 schematically shows a cross section of a semiconductor device in accordance with the third embodiment of the present invention.

FIG. 21 schematically shows a cross section of a semiconductor device in accordance with a third illustrated embodiment of the present invention. The semiconductor device 5 in accordance with the third embodiment is similar to the first embodiment shown in FIG. 15, and is a DRAM mixed-mount type semiconductor device. The same reference numerals are used for elements of the semiconductor device 5 of the third embodiment, which have functions equivalent to those of the semiconductor device 1 of the first embodiment. Portions of the semiconductor device 5 different from the semiconductor device 1 are described, and the description of the equivalent portions is omitted.

In the semiconductor device 5, a resistance element 400 has a resistance value of, for example, 5~10 Ω, and its minimum resistance value is smaller than that of the resistance element 400 of the semiconductor device 1 of the first embodiment. This is because a titanium silicide layer 81 is present over the resistance element 400 of the semiconductor device 5 in accordance with the third embodiment. The titanium silicide layer 81 is also located over a cell plate 67 and upper electrodes 69a and 69b.

Also, in accordance with the semiconductor device 5, a silicon oxide layer 77 is located over a resistance element 500. The silicon oxide layer 77 is used as a mask in the step of forming the titanium silicide layer 81. The detail thereof is described below in connection with a device manufacturing method.

By the semiconductor device 5, the four effects described above in connection with the semiconductor device 1 of the first embodiment are preferably created.

Figure 19:
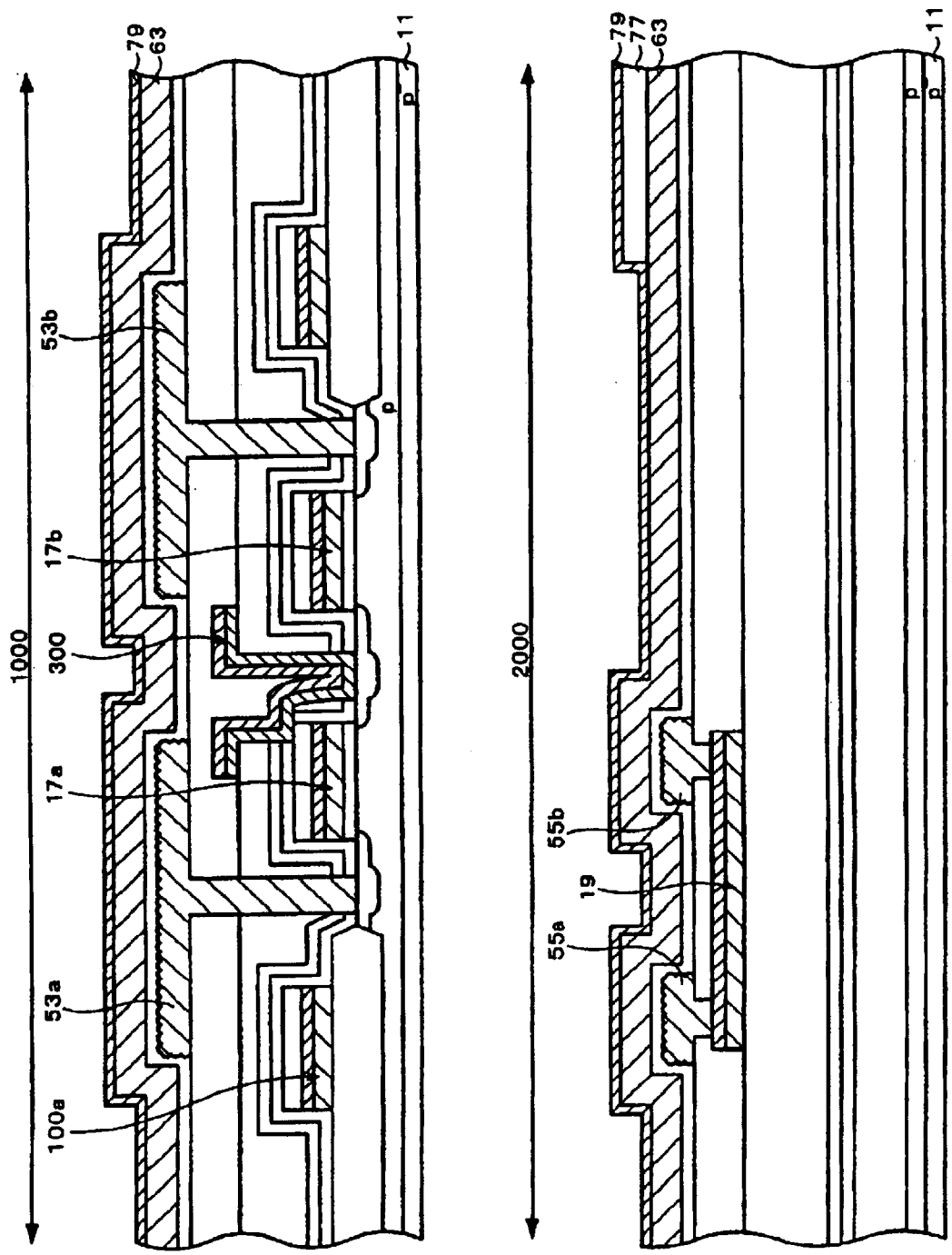
FIG. 19 schematically shows a cross section of a silicon substrate, which is used to describe a method for manufacturing a semiconductor device in accordance with a third embodiment of the present invention.
Figure 20:
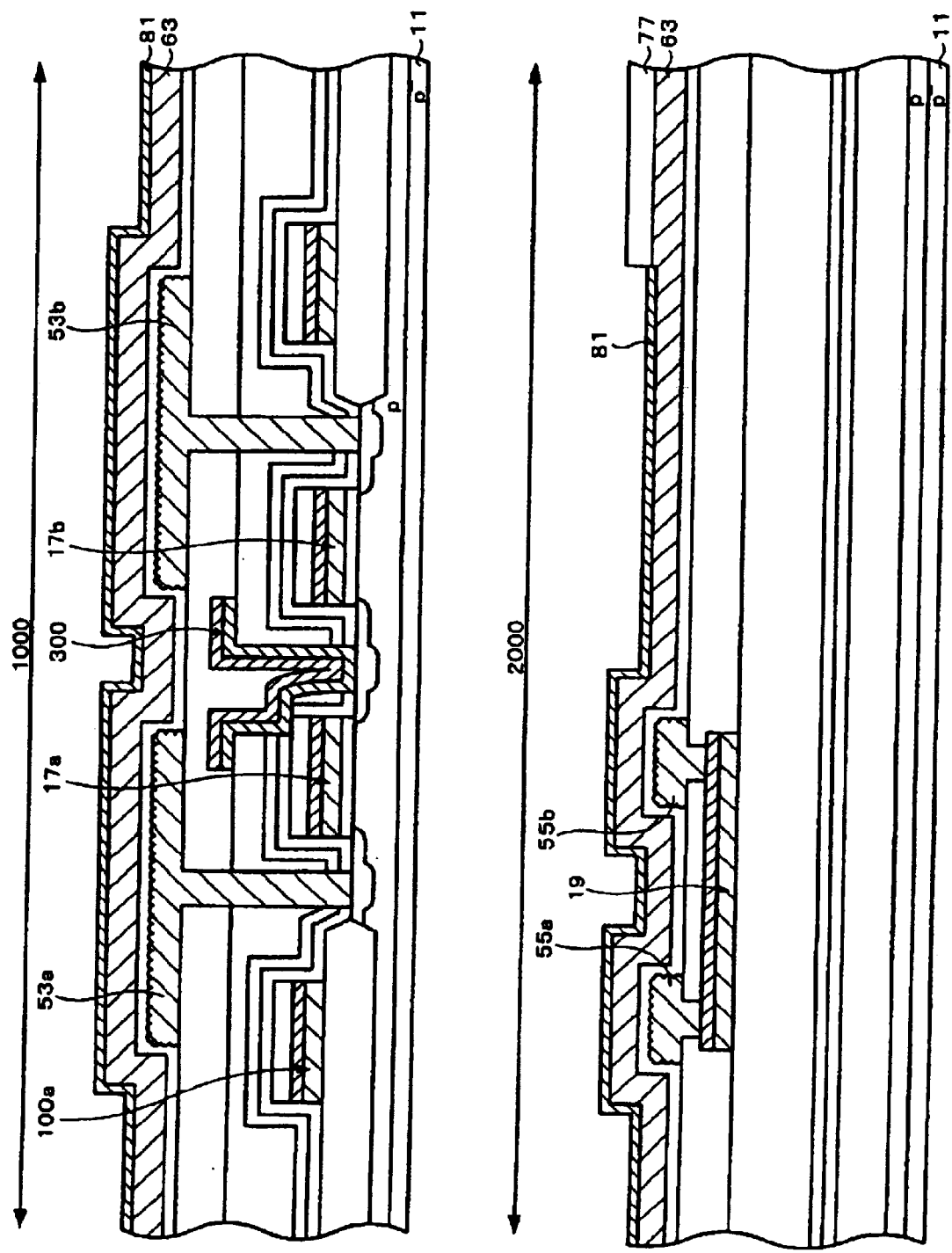
FIG. 20 schematically shows a cross section of the silicon substrate, which is used to describe a method for manufacturing a semiconductor device in accordance with the third embodiment of the present invention.

A method for manufacturing the semiconductor device 5 shown in FIG. 21 is described with reference to FIGS. 19 and 20. FIGS. 19 and 20 show steps in the method for manufacturing the semiconductor device 5.

First, the steps shown in FIGS. 1 through 12 are conducted in a similar manner as conducted in the first embodiment. Then, the steps shown in FIG. 16 are conducted in a similar manner as conducted in the second embodiment.

As shown in FIG. 19, a titanium layer 79 is formed to a thickness of 20~50 nm in a manner to cover the polycrystal silicon layer 63 and the silicon oxide layer 77 by, for example, a sputtering method. Then, the P⁻ type semiconductor substrate 11 with the titanium layer 79 formed thereon is subject to a first thermal treatment in, for example, a nitrogen atmosphere. The first heat treatment is conducted, for example, at temperatures of 650~750° C. for 30~60 seconds.

By the first heat treatment, a titanium silicide layer 81 is formed as shown in FIG. 20. Then, the titanium nitride layer and non-reacted portions of the titanium layer are removed by, for example, a wet etching method. Then, for example, a second heat treatment is conducted. The second heat treatment is conducted, for example, at temperatures of 800~850° C. for 30~60 seconds. By the second heat treatment, the titanium silicide layer 81 over the cell plate 67, upper electrodes 69a and 69b, and on the resistance element 400 undergoes a phase transition from a high resistance crystal structure (C49 structure) to a low resistance crystal structure (C54 structure).

Succeeding steps are the same as those of the method for manufacturing the semiconductor device 1 of the first embodiment, and therefore the description thereof is omitted.

By the method for manufacturing the semiconductor device 5 in accordance with the third embodiment, the first two effects described above in connection with the semiconductor device 1 of the first embodiment are preferably created.

Furthermore, in accordance with the method for manufacturing the semiconductor device 5 in accordance with the third embodiment, the resistance elements 400 and 500 having different resistance values can be formed, and the minimum resistance value of the resistance element 400 can be lowered.

Figure 22:
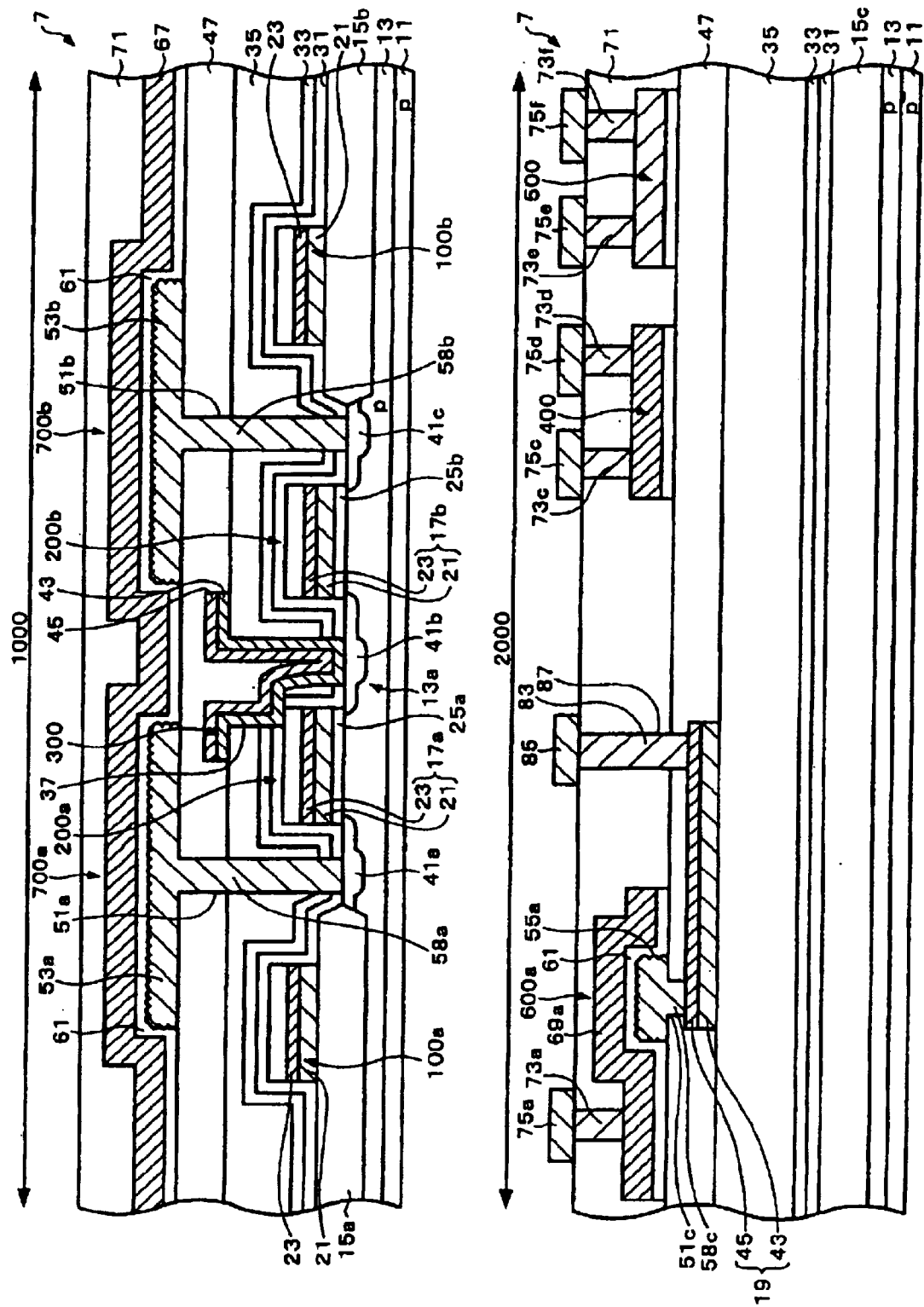
FIG. 22 schematically shows a cross section of a semiconductor device in accordance with a fourth embodiment of the present invention.

FIG. 22 schematically shows a cross section of a semiconductor device in accordance with a fourth illustrated embodiment of the present invention. The semiconductor device 7 in accordance with the fourth embodiment is similar to the first embodiment shown in FIG. 15, and is a DRAM mixed-mount type semiconductor device. The same reference numerals are used for elements of the semiconductor device 7 of the fourth embodiment, which have functions equivalent to those of the semiconductor device 1 of the first embodiment. Portions of the semiconductor device 7 different from the semiconductor device 1 are described, and the description of the equivalent portions is omitted.

The semiconductor device 7 does not have a structure in which two capacitor elements are connected in series to each other, but has a structure having only a capacitor element 600a. If only one capacitor element is provided, and the capacitor element does not possibly have a dielectric breakdown, the semiconductor device 7 can have the structure shown in accordance with the fourth embodiment.

Next, the electrical conduction between the lower electrode 55a and the wirings is described. One end section of the connection layer 19 connects to the embedded connection layer 58c that is integrally formed with the lower electrode 55a, in a similar manner as the embodiments described above. The other end section of the connection layer 19 communicates with a contact hole 87 that is formed in the interlayer dielectric layers 71 and 47. A tungsten plug 83 that functions as an embedded connection layer is filled in the contact hole 87. The tungsten plug 83 connects to the other end section of the connection layer 19. A wiring layer such as, for example, an aluminum wiring layer 85 that connects to the tungsten plug 83 is provided over the interlayer dielectric layer 71.

In accordance with the semiconductor device 7, the first three effects described above in connection with the semiconductor device 1 of the first embodiment are preferably created.

The semiconductor device 7 shown in FIG. 22 can be manufacture by a method similar to the method for manufacturing the semiconductor device 1 of the first embodiment. It is noted that, by using the method for manufacturing the semiconductor device 3 of the second embodiment, the resistance element 400 and the resistance element 500 of the semiconductor device 7 can be provided with the same resistance values as the resistance values of the resistance element 400 and the resistance element 500 of the semiconductor device 3, respectively. Also, by using the method for manufacturing the semiconductor device 5 in accordance with the third embodiment, the resistance element 400 and the resistance element 500 of the semiconductor device 7 can be provided with the same resistance values as the resistance values of the resistance element 400 and the resistance element 500 of the semiconductor device 5, respectively.

While the description above refers to particular embodiments of the present invention, it will be understood that many modifications may be made without departing from the spirit thereof. The accompanying claims are intended to cover modifications that fall within the true scope and spirit of the present invention.

What is claimed:

1. A method for manufacturing a semiconductor device, the semiconductor device having a DRAM including a cell capacitor formed in a DRAM region of a semiconductor substrate, and a capacitor element formed in an analog element region of the semiconductor substrate, the method comprising the steps of:
   (a) simultaneously forming a bit line that is a component of the DRAM and a connection layer that is located in a common layer with the bit line and which is used to electrically connect a lower electrode of the capacitor element and another semiconductor element;
   (b) simultaneously forming a storage node of the cell capacitor and the lower electrode of the capacitor element;
   (c) simultaneously forming a dielectric layer of the cell capacitor and a dielectric layer of the capacitor element; and
   (d) simultaneously forming a cell plate of the cell capacitor and an upper electrode of the capacitor element.

2. A method for manufacturing a semiconductor device according to claim 1, further comprising the step of:
   (e) forming a first resistance element and a second resistance element in the analog element region,
   wherein the step (e) is carried out simultaneously with the step (d), and wherein a number of ion-implantations of impurity in a region where the first resistance element is to be formed is greater than a number of ion-implantations of impurity in a region where the second resistance element is to be formed so that a resistance value of the first resistance element is lower than a resistance value of the second resistance element.

3. A method for manufacturing a semiconductor device according to claim 1, further comprising the step of:
(e) forming a first resistance element and a second resistance element in the analog element region,
wherein the step (e) is carried out simultaneously with the step (d), and
wherein an impurity is diffused in a region where the first resistance element is to be formed so that a resistance value of the first resistance element is lower than a resistance value of the second resistance element.

4. A method for manufacturing a semiconductor device according to claim 1, further comprising the step of:
(e) forming a first resistance element and a second resistance element in the analog element region,
wherein the step (e) is carried out simultaneously with the step (d), and
wherein a silicide layer is formed in a region where the first resistance element is to be formed so that a resistance value of the first resistance element is lower than a resistance value of the second resistance element.

5. A method for manufacturing a semiconductor device according to claim 1, further comprising forming a first resistance element and a second resistance element in the analog element region, the first resistance element and the second resistance element each being formed in a region comprising a semiconductor, wherein forming the first resistance element includes performing a number of ion-implantations of impurity that is greater than a number of ion-implantations performed for forming the second resistance element, so that a resistance value of the first resistance element is lower than that of the second resistance element.

6. A method for manufacturing a semiconductor device according to claim 5, wherein the semiconductor comprises silicon.

7. A method for manufacturing a semiconductor device according to claim 1, further comprising forming a first resistance element and a second resistance element in the analog element region, the first resistance element and the second resistance element each being formed in a region comprising a semiconductor, wherein forming the first resistance element includes diffusing an impurity into the region comprising a semiconductor, so that the first resistance element has a resistance value that is lower than that of the second resistance element.

8. A method for manufacturing a semiconductor device according to claim 7, wherein the semiconductor comprises silicon.

9. A method for manufacturing a semiconductor device according to claim 1, further comprising forming a first resistance element and a second resistance element in the analog element region, the first resistance element and the second resistance element each being formed in a region comprising polysilicon, wherein the first resistance element formed to include a silicide layer and the first resistance element is formed to have a resistance value that is lower than that of the second resistance element.

10. A method for manufacturing a semiconductor device, the semiconductor device having a DRAM including a cell capacitor formed in a DRAM region of a semiconductor substrate, and a capacitor element formed in an analog element region of the semiconductor substrate, the method comprising:
forming a first conducting layer and etching a portion of the first conducting layer to form a bit line that is a component of the DRAM and a connection layer that is located in a common layer with the bit line and used to electrically connect a lower electrode of the capacitor element and another semiconductor element;
forming a second conducting layer and etching a portion of the second conducting layer to form a storage node of the cell capacitor and the lower electrode;
forming a dielectric layer and etching a portion of the dielectric layer to form a dielectric layer of the cell capacitor and a dielectric layer of the capacitor element; and
forming a third conducting layer and etching a portion of the third conducting layer to form a cell plate of the cell capacitor and an upper electrode of the capacitor element.

11. A method according to claim 10, further comprising forming a first resistance element and a second resistance element in the analog element from the third conducting layer, wherein the first resistance element and second resistance element are formed so that a resistance value of the first resistance element is lower than a resistance value of the second resistance element.

12. A method for manufacturing a semiconductor device according to claim 11, wherein the third conducting layer comprises a semiconductor.

13. A method for manufacturing a semiconductor device according to claim 11, wherein the third conducting layer comprises polysilicon.

14. A method for manufacturing a semiconductor device according to claim 13, further comprising forming the first resistance element to include a silicide layer.

15. A method for manufacturing a semiconductor device according to claim 11, wherein the third conducting layer comprises polysilicon, and further comprising forming the first resistance element by a method including implanting an impurity into a region of the polysilicon.

16. A method for manufacturing a semiconductor device according to claim 11, wherein the third conducting layer comprises polysilicon, and further comprising forming the first resistance element and the second resistance element by a method including implanting a greater amount of an impurity into the first resistance element than into the second resistance element.

* * * * *